(12) United States Patent
Kamikawa et al.

(10) Patent No.: US 7,157,297 B2
(45) Date of Patent: Jan. 2, 2007

(54) METHOD FOR FABRICATION OF SEMICONDUCTOR DEVICE

(75) Inventors: Takeshi Kamikawa, Mihara (JP); Eiji Yamada, Mihara (JP); Masahiro Araki, Mihara (JP)

(73) Assignee: Sharp Kabushiki Kaisha, Osaka (JP)

( * ) Notice: Subject to any disclaimer, the term of this patent is extended or adjusted under 35 U.S.C. 154(b) by 20 days.

(21) Appl. No.: 11/125,111

(22) Filed: May 10, 2005

(65) Prior Publication Data

US 2005/0250234 A1    Nov. 10, 2005

(30) Foreign Application Priority Data

May 10, 2004   (JP)   ............................. 2004-139919
Jun. 10, 2004   (JP)   ............................. 2004-172291

(51) Int. Cl.
*H01L 21/00*   (2006.01)
(52) U.S. Cl. .................... 438/33; 438/41; 438/44; 438/483; 257/E21.09
(58) Field of Classification Search ............ 438/22–47, 438/479–483, 459–465; 257/E21.09, E21.097
See application file for complete search history.

(56) References Cited

U.S. PATENT DOCUMENTS

| | | | |
|---|---|---|---|
| 6,316,785 B1 * | 11/2001 | Nunoue et al. ............. 257/14 |
| 6,500,257 B1 * | 12/2002 | Wang et al. ................ 117/95 |
| 6,566,231 B1 * | 5/2003 | Ogawa et al. .............. 438/448 |
| 6,864,160 B1 * | 3/2005 | Linthicum et al. .......... 438/479 |
| 6,984,841 B1 * | 1/2006 | Tsuda et al. ................ 257/12 |
| 2001/0030329 A1 * | 10/2001 | Ueta et al. .................. 257/103 |
| 2002/0056846 A1 * | 5/2002 | Tsuda et al. ................ 257/86 |
| 2002/0137249 A1 * | 9/2002 | Ishida et al. ................ 438/47 |
| 2004/0113141 A1 * | 6/2004 | Isuda et al. ................. 257/13 |
| 2005/0151153 A1 * | 7/2005 | Kamikawa et al. ......... 257/103 |
| 2005/0186694 A1 * | 8/2005 | Takakura et al. ............ 438/28 |
| 2005/0277212 A1 * | 12/2005 | Kamikawa .................. 438/21 |

FOREIGN PATENT DOCUMENTS

| | | |
|---|---|---|
| JP | 2000-299497 | * 10/2000 |
| JP | 2002/246698 | 8/2002 |
| JP | 2004/356454 | 12/2004 |

* cited by examiner

*Primary Examiner*—Savitri Mulpuri
(74) *Attorney, Agent, or Firm*—Morrison & Foerster LLP

(57) ABSTRACT

On a processed substrate having an engraved region as a depressed portion formed thereon, a nitride semiconductor thin film is laid. The sectional area occupied by the nitride semiconductor thin film filling the depressed portion is 0.8 times the sectional area of the depressed portion or less.

16 Claims, 21 Drawing Sheets

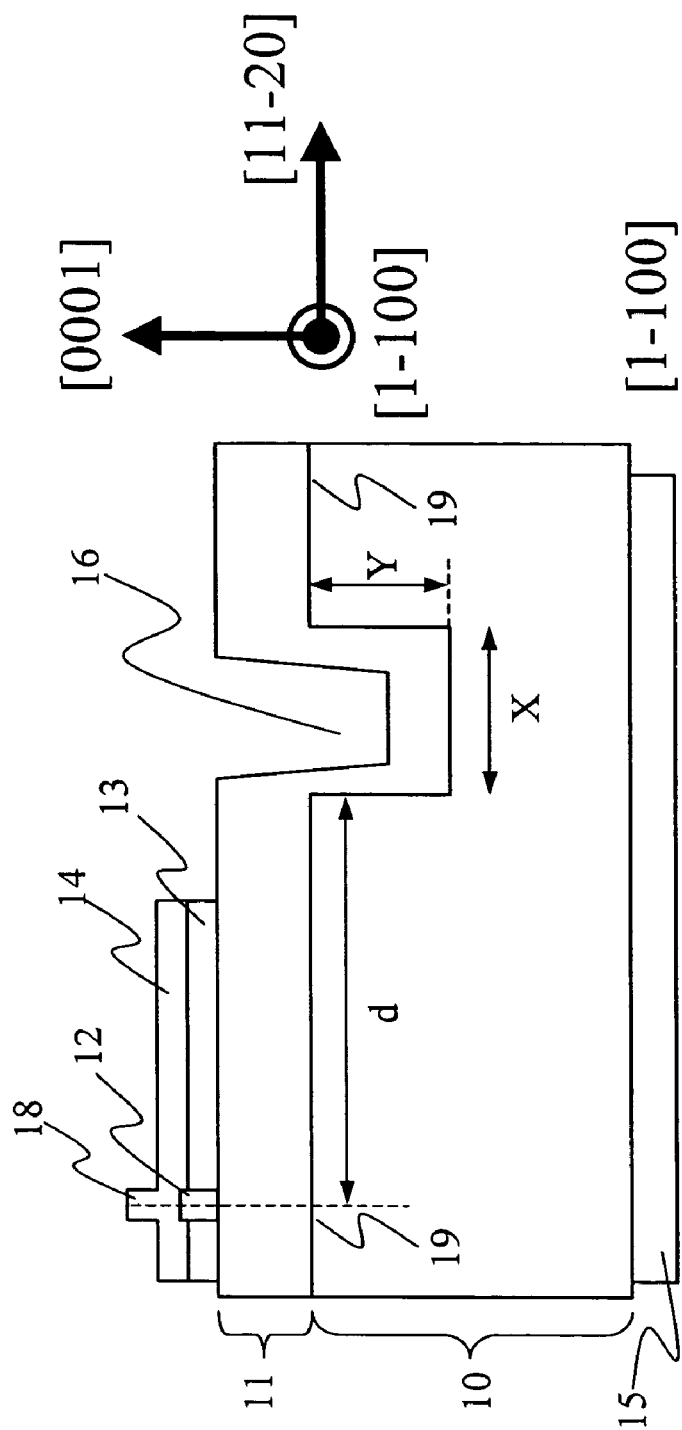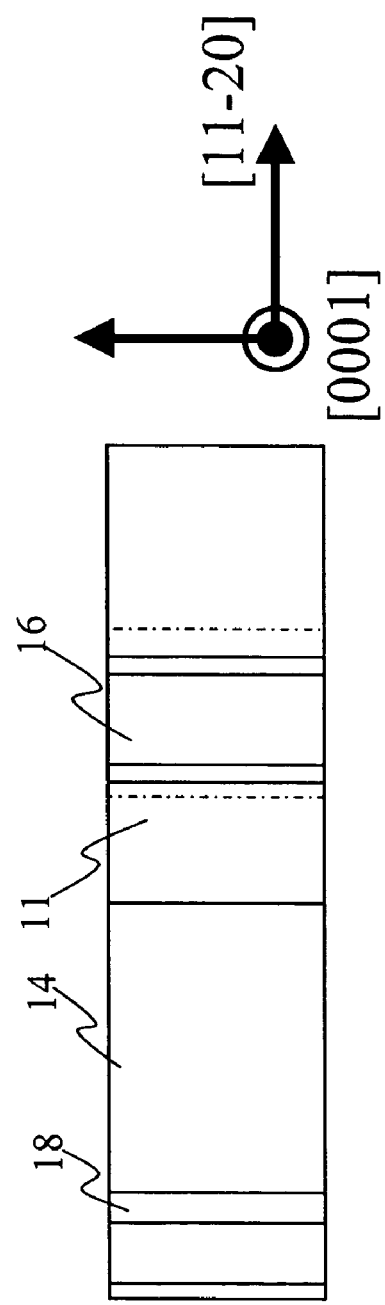
Fig.1a
Fig.1b

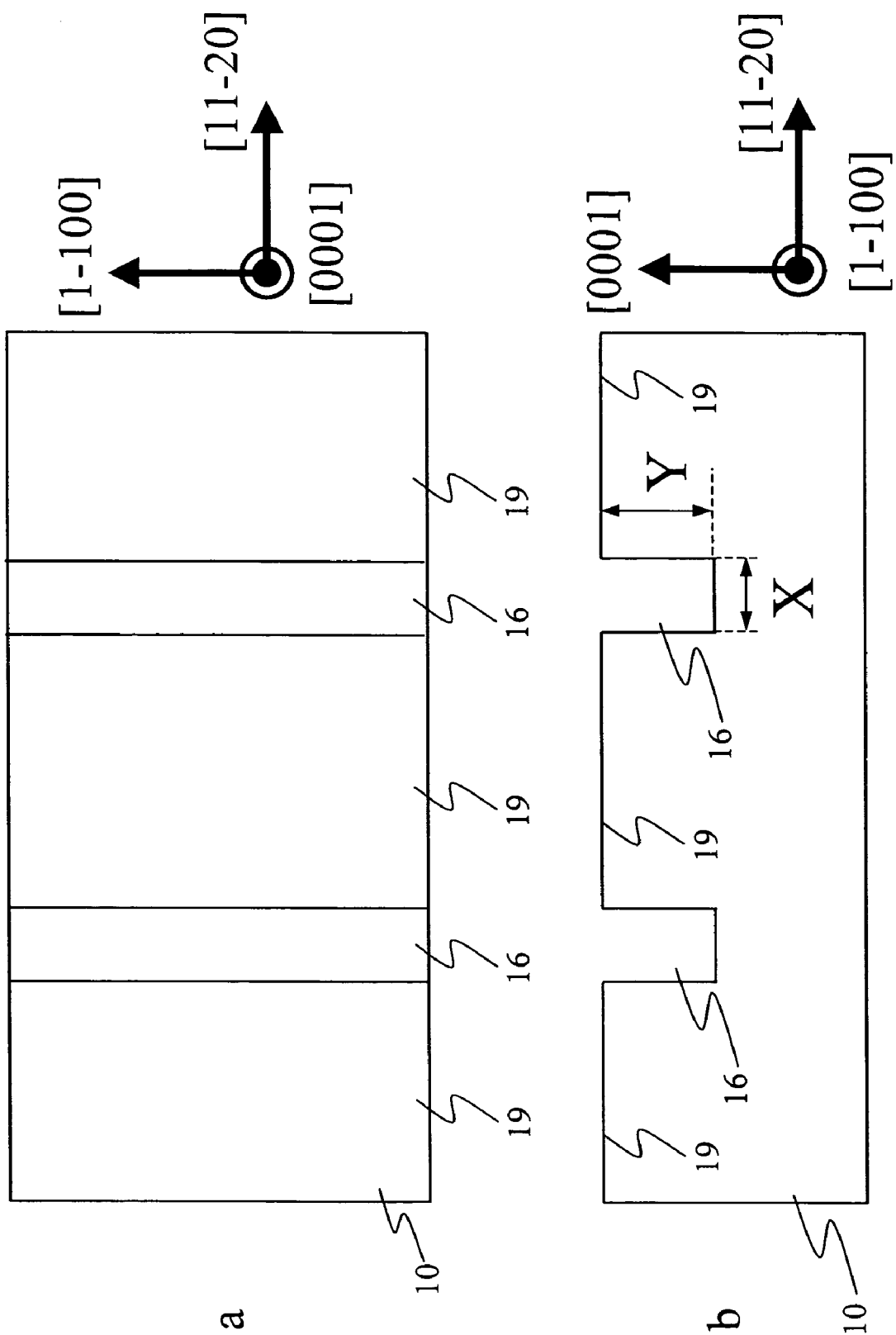

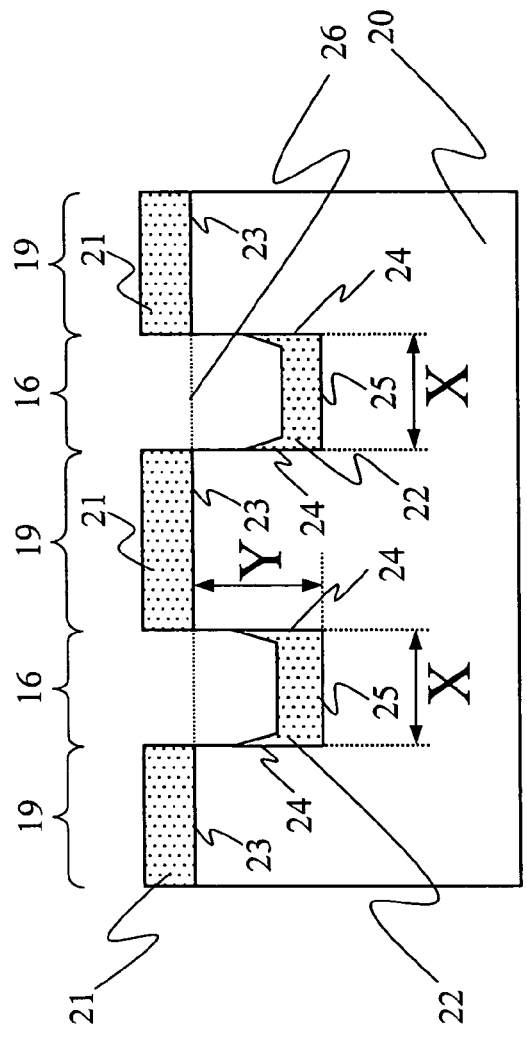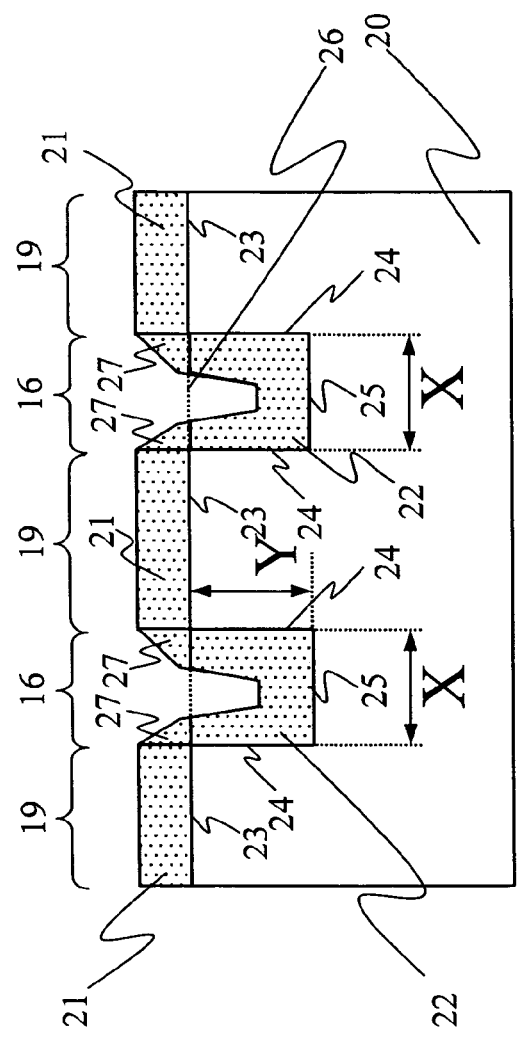
Fig.4a
Fig.4b

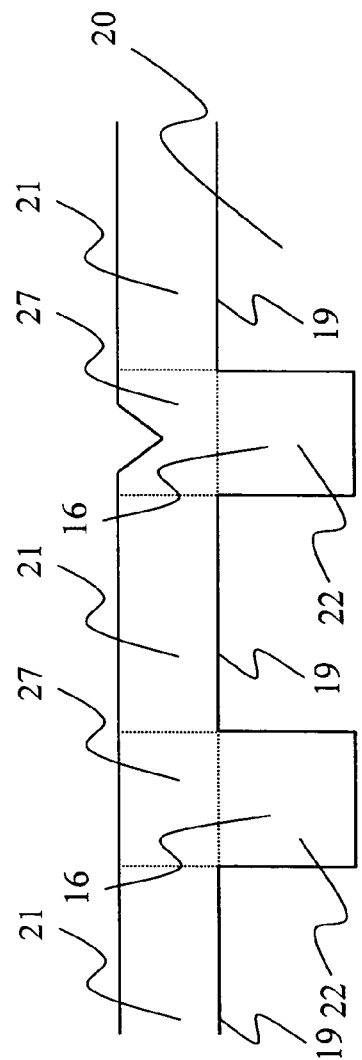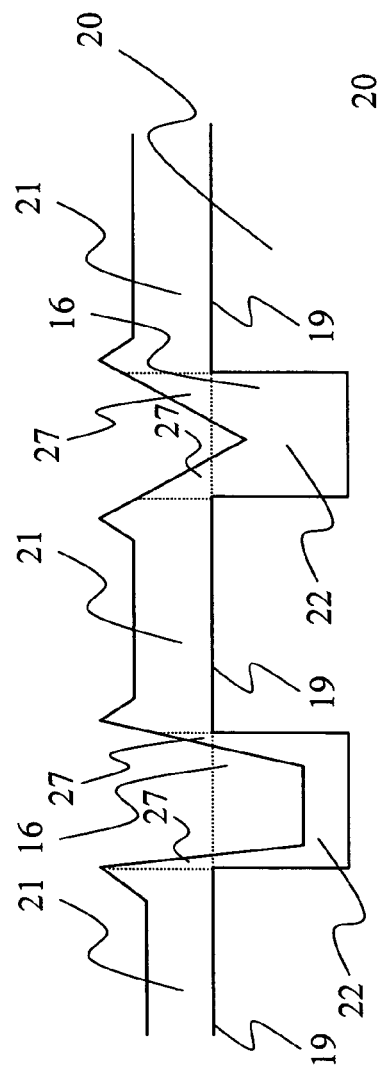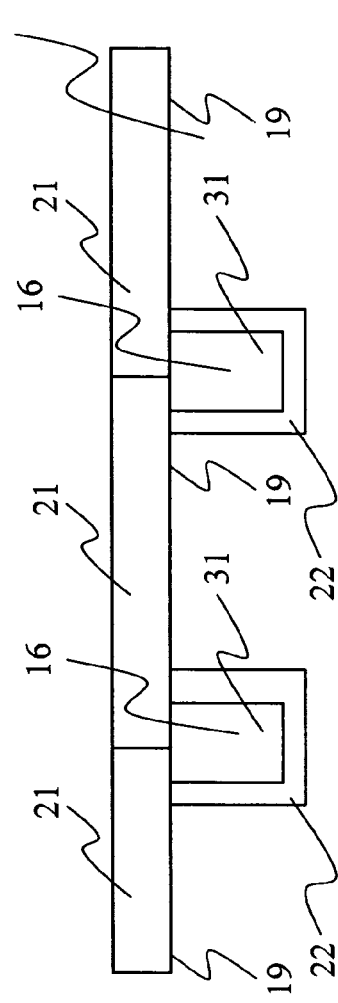

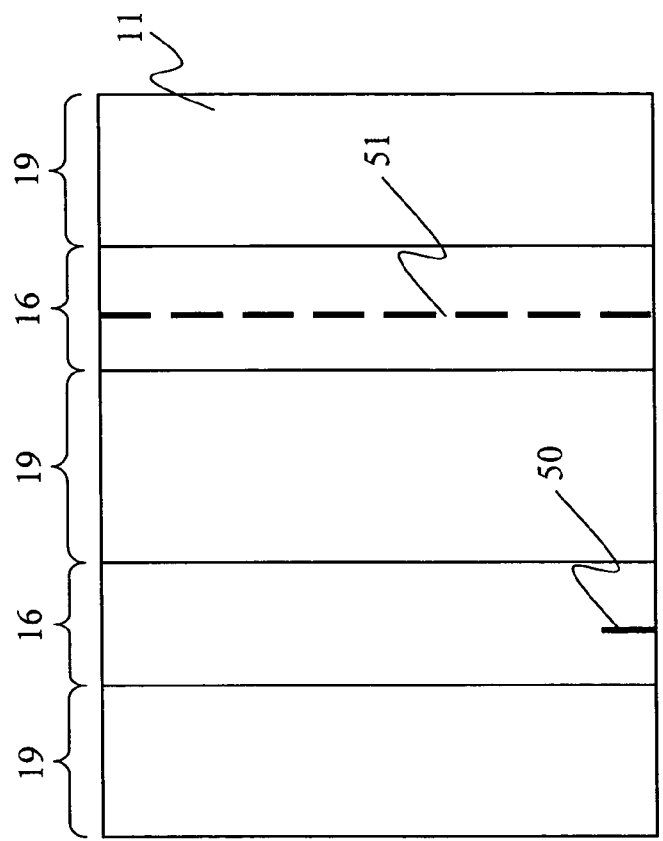
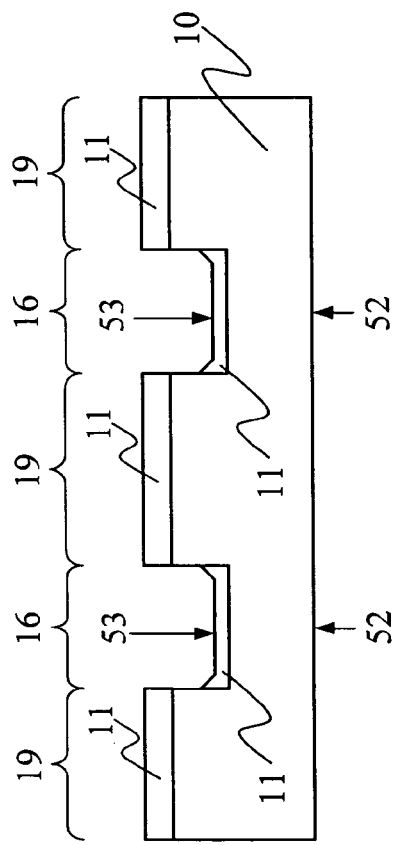
Fig.8a
Fig.8b

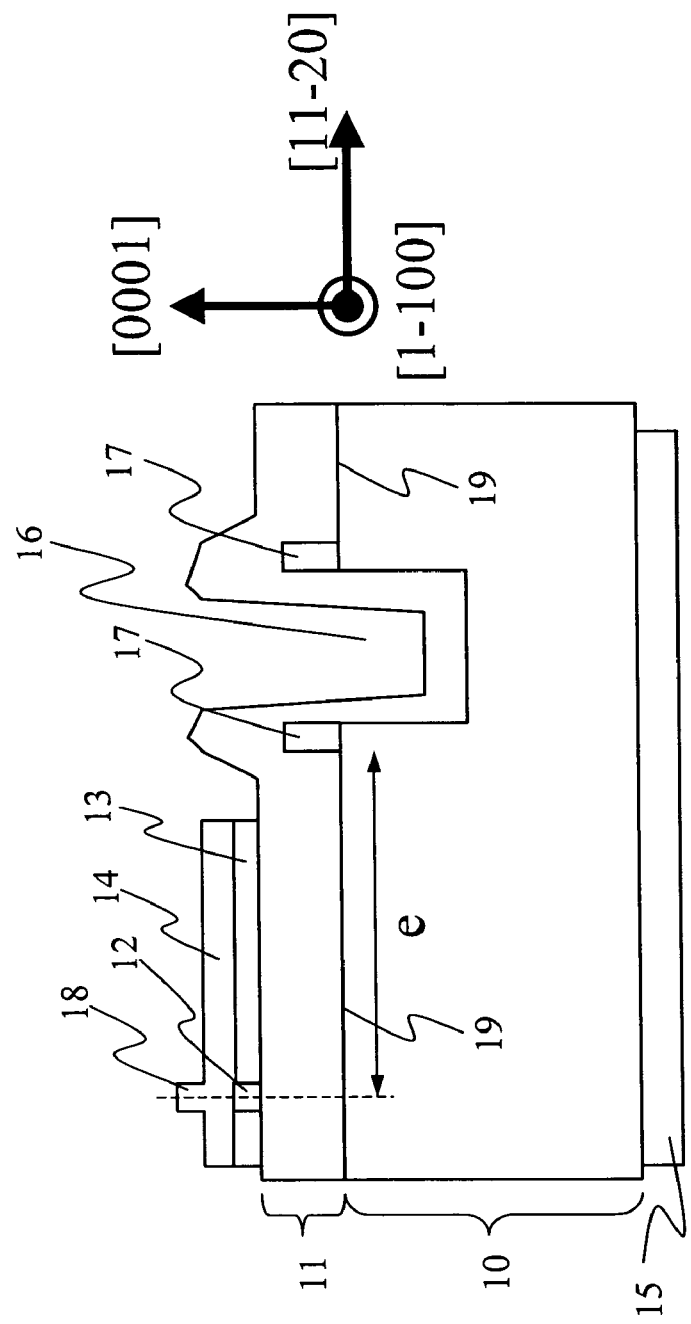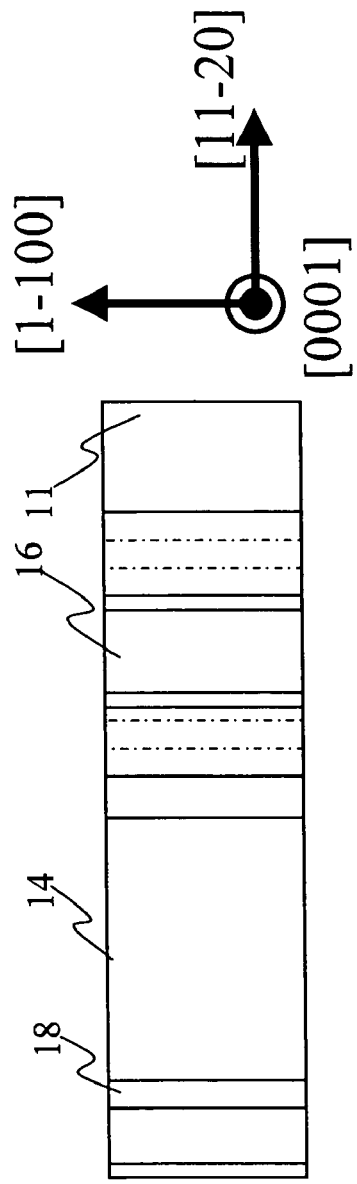
Fig.11a
Fig.11b

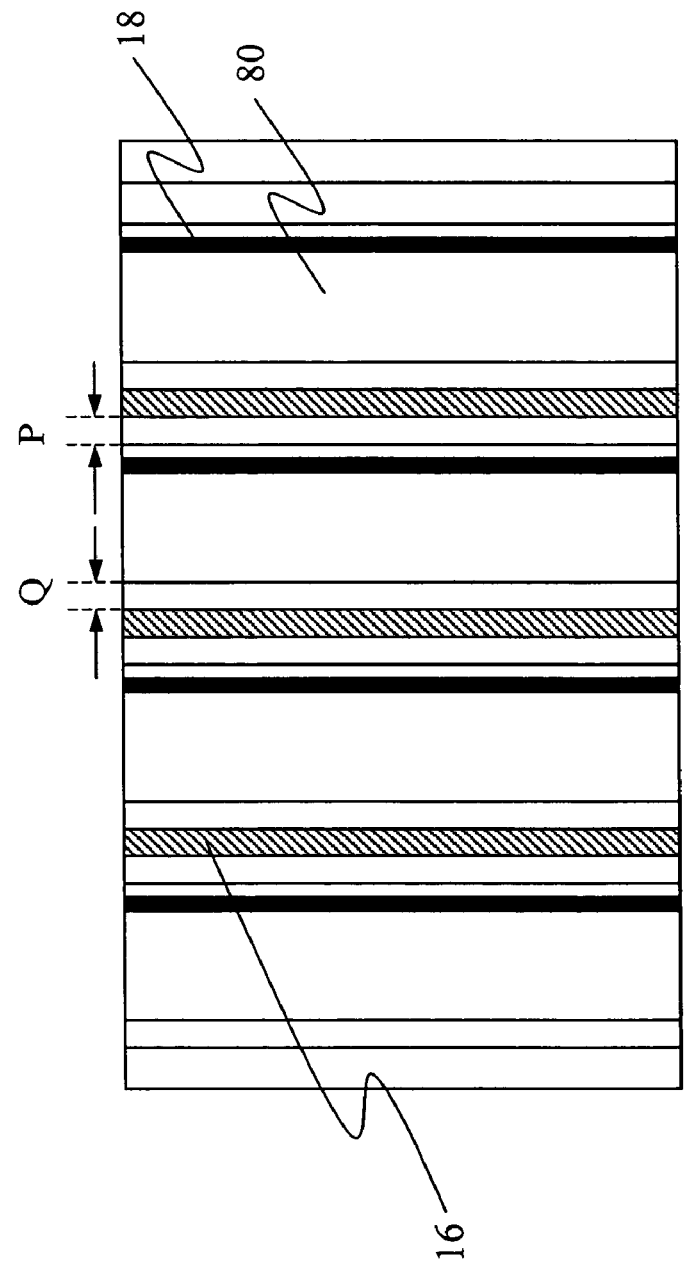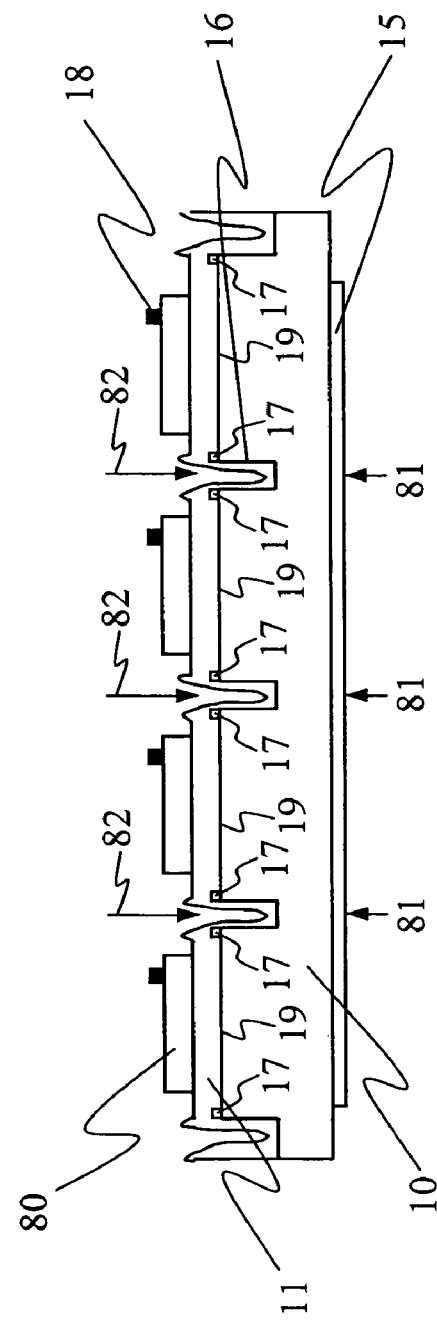
Fig.15a
Fig.15b

US 7,157,297 B2

METHOD FOR FABRICATION OF SEMICONDUCTOR DEVICE

This nonprovisional application claims priority under 35 U.S.C. § 119(a) on Patent Applications Nos. 2004-139919 and 2004-172291 filed in Japan on May 10, 2004 and Jun. 10, 2004, respectively, the entire contents of which are hereby incorporated by reference.

BACKGROUND OF THE INVENTION

1. Field of the Invention

The present invention relates to a semiconductor device such as a nitride semiconductor laser device, and to a method for the fabrication thereof.

2. Description of Related Art

As compared with AlGaInAs- and AlGaInP-based semiconductors, nitride semiconductors such as GaN, AlGaN, GaInN, AlGaInN, and mixed crystals thereof are characterized by their larger band gaps Eg and their being direct-transition semiconductor materials. These properties make nitride semiconductors attractive materials for semiconductor light-emitting devices such as semiconductor lasers that emit light in a short-wavelength region from ultraviolet to green and light-emitting diodes that cover a wide light emission wavelength range from ultraviolet to red. Thus, nitride semiconductors are believed to find wide application in high-density optical disks and full-color displays to environmental and medical fields.

Moreover, nitride semiconductors offer higher thermal conductivity than GaAs-based and other semiconductors, and are thus expected to find application in high-temperature, high-output devices. Furthermore, nitride semiconductors do not require the use of such materials as correspond to arsenic (As) in AlGaAs-based semiconductors or cadmium in ZnCdSSe-based semiconductors or source materials therefor such as arsine ($AsH_3$), and are thus expected as environment-friendly compound semiconductor materials.

One conventional problem with nitride semiconductors is that, in the fabrication of nitride semiconductor devices as exemplified by nitride semiconductor laser devices, the yield, i.e., the ratio of the number of properly working nitride semiconductor laser devices to the total number of those produced on a single wafer, is extremely low.

The reasons are as follows. To separate the individual nitride semiconductor laser devices produced on a wafer from one another, first, the wafer is cleaved in the direction perpendicular to the direction of the resonators of the nitride semiconductor laser devices so that the wafer is split into bars having resonator end faces formed at the cleavage surfaces. Next, to further separate the individual nitride semiconductor laser devices now lying together on separate pieces of a nitride semiconductor substrate in the form of bars cleaved from one another, the thus produced bars need to be further split in the direction parallel to the direction of the resonators. Here, when the wafer is split into bars, if the nitride semiconductor substrate is of a nitride semiconductor such as n-type GaN, both the nitride semiconductor substrate and the nitride semiconductor growth layer laid on top thereof have cleavage surfaces in the direction perpendicular to the direction of the resonators, and thus they can be cleaved easily.

However, since a nitride semiconductor substrate of a nitride semiconductor such as n-type GaN has a hexagonal crystal structure and thus does not have cleavage surfaces in the direction parallel to the direction of the resonators, it is difficult to split the bar further into discrete nitride semiconductor laser devices. Thus, the splitting here causes chipping and cracking, and in addition cleavage in unintended directions, leading to a low yield.

According to one conventionally proposed solution to this problem, after a nitride semiconductor growth layer is laid on top of a substrate, grooves are formed, with a dicing machine, from the surface of the nitride semiconductor growth layer halfway into the thickness of the substrate, then the substrate is polished to become thinner, then scribe lines are drawn on the surface of the grooves formed with the dicing machine, and then a load is applied to the substrate. This helps separate individual nitride semiconductor laser devices from one another at a good yield (see Japanese Patent Application Laid-Open No. H5-315646).

Another cause for a low yield is development of cracks. Such cracks may originate from the nitride semiconductor growth layer laid on top of the substrate. Specifically, when a nitride semiconductor laser device is produced, a nitride semiconductor growth layer is laid on top of a substrate, and this nitride semiconductor growth layer is composed of different types of film, such as films of GaN, AlGaN, and InGaN. Here, the different films forming the nitride semiconductor growth layer have different lattice constants, and thus cause lattice mismatch, resulting in development of cracks. To avoid this, according to one conventionally proposed method, a processed substrate is used, and, after a nitride semiconductor growth layer is formed on top thereof, depressions are formed on the surface of the nitride semiconductor growth layer instead of the surface being flattened. This helps reduce cracks (see Japanese Patent Application Laid-Open No. 2002-246698). By the use of this method, it is possible to reduce, for example, cracks resulting from mismatching among the lattice constants of the individual films that constitute the nitride semiconductor growth layer formed on top of the substrate.

When a nitride semiconductor laser device is produced by the use of the technique disclosed in Japanese Patent Application Laid-Open No. 2002-246698 mentioned above, the nitride semiconductor growth layer is structured, for example, as shown in FIG. 19.

Specifically, on the surface of a processed substrate 10 (see FIGS. 18a and 18b) formed of an etched n-type GaN substrate or the like, a nitride semiconductor growth layer 11 is formed that is composed of, for example, the following layers laid on top of one another in the order named: a 1.0 µm thick n-type GaN layer 100; a 1.5 µm thick n-type $Al_{0.062}Ga_{0.938}N$ first clad layer 101; a 0.2 µm thick n-type $Al_{0.1}Ga_{0.9}N$ second clad layer 102; a 0.1 µm thick n-type $Al_{0.062}Ga_{0.938}N$ third clad layer 103; a 0.1 µm thick n-type GaN guide layer 104; a multiple quantum well active layer 105 consisting of three 4 nm thick InGaN well layers and four 8 nm thick GaN barrier layers; a 20 nm thick p-type $Al_{0.3}Ga_{0.7}N$ evaporation prevention layer 106; a 0.05 µm thick p-type GaN guide layer 107; a 0.5 µm thick p-type $Al_{0.062}Ga_{0.938}N$ clad layer 108; and a 0.1 µm thick p-type GaN contact layer 109. The multiple quantum well active layer 105 has the layers thereof laid in the following order: a barrier layer, a well layer, a barrier layer, a well layer, a barrier layer, a well layer, and a barrier layer.

In crystallography, it is common practice, when an index indicating a plane or orientation of a crystal is negative, to express the index with an overscore placed above the absolute value thereof. In the following descriptions, since such notation is impossible, a negative index is expressed by a minus sign "−" followed by the absolute value thereof.

In the present specification, a "dissimilar substrate" denotes a substrate other than one formed of a nitride semiconductor. Examples of dissimilar substrates include sapphire substrates, SiC substrates, and GaAs substrates.

A "processed substrate" denotes a substrate having engraved regions and ridges formed on the surface of a nitride semiconductor substrate or on the surface of a nitride semiconductor thin film laid on the surface of a nitride semiconductor substrate or dissimilar substrate. In the following descriptions, the layer formed by laying on top of one another the layers doped with Mg, namely the p-type $Al_{0.3}Ga_{0.7}N$ evaporation prevention layer 106, the p-type GaN guide layer 107, the p-type $Al_{0.062}Ga_{0.938}N$ clad layer 108, and the p-type GaN contact layer 109, will be referred to as the "p-layer".

On the processed surface of the processed substrate 10, the nitride semiconductor growth layer 11 is laid by MOCVD (metal organic chemical vapor deposition) to form a nitride semiconductor wafer having depressions on the surface of the nitride semiconductor growth layer 11 as shown in FIGS. 18a and 18b. In FIGS. 18a and 18b, plane orientations are indicated together.

In FIG. 18b, an n-type GaN substrate is used as the substrate 10, and there are formed engraved regions 16 and ridges 19 in the shape of stripes in the [1-100] direction by dry etching such as RIE (reactive ion etching). The engraved regions are 5 μm wide and 3 μm deep, and the interval between two adjacent engraved regions is 15 μm. On top of the thus etched substrate 10, the nitride semiconductor growth layer 11 structured as shown in FIG. 19 is produced by a growth method such as MOCVD.

Disappointingly, however, when nitride semiconductor laser devices were produced by the use of the technique disclosed in Japanese Patent Application Laid-Open No. 2002-246698 mentioned above, with an n-type GaN substrate used as a substrate 10 and with a nitride semiconductor growth layer 11 epitaxially grown on top of this n-type GaN substrate by MOCVD or the like, it was indeed possible to reduce cracks, but it was not possible to significantly increase the yield. Specifically, by the use of the technique disclosed in Japanese Patent Application Laid-Open No. 2002-246698, a plurality of nitride semiconductor laser devices were produced, of which 100 were randomly extracted and subjected to the measurement of the FWHMs (full widths at half maximum) of their FFPs (far field patterns) in the horizontal and vertical directions. Here, those nitride semiconductor laser devices which exhibited FFPs of which the FWHMs were within ±1° of the design value thereof were evaluated as acceptable. The result was that the number of nitride semiconductor laser devices that exhibited FFPs of which the FWHMs fulfilled the requirement was 30, a very low yield.

This is because leaving depressions on the nitride semiconductor growth layer 11 degrades the flatness of the film. Degraded flatness causes variations in the thicknesses of the individual layers within the nitride semiconductor growth layer 11, and thus causes the characteristics of the nitride semiconductor laser devices to vary from one individual to another, reducing the number of devices of which the characteristics fall within the required ranges. Thus, to increase the yield, it is necessary not only to reduce cracks but also to enhance the flatness of the film.

Also measured was the surface flatness within the surface of the nitride semiconductor wafer formed as shown in FIGS. 18a, 18b, and 19. The result of the measurement obtained by measuring the surface flatness in the [1-100] direction is shown in FIG. 20. The measurement was conducted under the following conditions: measurement length: 600 μm; measurement time: 3s; probe pressure: 30 mg; and horizontal resolution: 1 μm/sample. From the graph of FIG. 20, the level difference between the highest and lowest parts of the surface within the 600 μm wide region measured was found to be 200 nm.

This difference in flatness results from, as shown in FIG. 18b, the thicknesses of the individual layers of the nitride semiconductor growth layer 11 laid on top of the substrate 10 varying from one position on the wafer to another. Consequently, the characteristics of nitride semiconductor laser devices vary greatly depending on where within the wafer surface they are produced, and the thickness of the Mg-doped p-layer (corresponding to the sum of the p-type layers laid as the p-type $Al_{0.3}Ga_{0.7}N$ evaporation prevention layer 106 to the p-type GaN contact layer 109 shown in FIG. 19), which thickness greatly affects the characteristics of nitride semiconductor laser devices, varies greatly from one position to another within the substrate surface.

When a ridge structure as a current constriction structure is formed, the ridges are left in the shape of 2 μm wide stripes, and the rest is etched away by a dry etching technique using an ICP (inductively coupled plasma) machine or the like. Thus, if the p-layer thickness before etching varies from one position to another within the wafer surface, the remaining p-layer thickness after etching, which most greatly affects the characteristics of nitride semiconductor laser devices, varies from one position to another within the wafer surface. As a result, not only does the layer thickness vary from one nitride semiconductor laser device to another, even within one nitride semiconductor laser device, the remaining p-layer thickness may be almost zero in some parts and quite large in other parts. These variations in the remaining p-layer thickness affect the lasing lives of nitride semiconductor laser devices and, as described above, the characteristics thereof such as the FWHMs of FFPs.

This large distribution of the layer thickness within the wafer surface is considered to result from the fact that the growth rate of the film that is epitaxially grown at the ridges on the processed substrate including a nitride semiconductor substrate varies under the influence of the engraved regions, resulting in uneven growth rates within the wafer surface.

Specifically, when epitaxial growth is started on a substrate 10 having engraved regions 16 formed thereon as shown in FIG. 21a, at an initial stage of growth, the parts of the nitride semiconductor thin film that grow on floor portions 124 and side portions 126 of the engraved regions 16, called the engraved region growth portions 122, only partially fill the engraved regions 16. At this stage, the parts of the nitride semiconductor thin film that grow on the surface of top portions 123 of the ridges 19, called the top growth portions 121, grows with the surface of the nitride semiconductor thin film kept flat.

As the epitaxial growth of the nitride semiconductor thin film proceeds from the above-described stage shown in FIG. 21a to a stage shown in FIG. 21b, where the engraved region growth portions 122, i.e., the parts of the nitride semiconductor thin film that grow on the floor portions 124 and side portions 126 of the engraved regions 16, almost completely fills the engraved regions 16, these parts become coupled, via growth portions 125, to the top growth portions 121, i.e., the parts of the nitride semiconductor thin film that grow on the surface of the top portions 123 of the ridges 19. At this stage, the source material atoms and molecules (for example, Ga atoms) that have attached to the surface of the nitride semiconductor thin film that has grown on the top portions 123 of the ridges 19 is made to migrate or otherwise move, by heat energy, into the growth portions 125 and engraved region growth portions 122. This migrating movement of atoms and molecules occurs extremely unevenly within the wafer surface, and the movement distance varies within the wafer surface. As a result, as shown in FIG. 21b, the flatness of the surface of the top growth portions 121 is degraded.

This flatness of the nitride semiconductor thin film is degraded also in the [1-100] direction under the influence of the unevenness of the nitride semiconductor substrate itself, such as the distribution of the off-angle within the wafer surface and the distribution of the substrate curvature within the wafer surface; the unevenness of the epitaxial growth rate within the substrate surface; the unevenness of the engraving process within the substrate surface; and other factors. Specifically, the time required for the engraved regions 16 to be filled varies in the [1-100] direction, and thus, where they are filled early, atoms and molecules of the source materials from which the nitride semiconductor thin film is formed migrate or otherwise move from the top growth portions 121 of the ridges 19 into the growth portions 125 or engraved region growth portions 122. Thus, where those atoms and molecules migrate to, it takes more time to form the nitride semiconductor thin film, with the result that the nitride semiconductor thin film formed in the engraved regions 16 becomes thicker. On the other hand, where the engraved regions 16 are incompletely filled, no atoms or molecules of the source materials from which the nitride semiconductor thin film is formed move from the top growth portions 121 of the ridges 19 into the engraved regions 16; even if they do, it takes less time to form the nitride semiconductor thin film. Thus, the nitride semiconductor thin film formed in the engraved regions 16 is thinner than where the engraved regions 16 are filled earlier.

In a so-called supply-governed state, i.e., a state in which the growth rate is governed by the flux or the like of the atoms and molecules supplied to the wafer surface, if atoms and molecules of the source materials from which the nitride semiconductor thin film is formed migrate or otherwise flow into the engraved regions 16, since the flux of the source material atoms and molecules supplied to the entire wafer surface is fixed, the top growth portions 121, where the nitride semiconductor thin film grows on the top portions 123 of the ridges 19, become thinner. Otherwise, i.e., if no atoms or molecules of the source materials from which the nitride semiconductor thin film is formed migrate or otherwise flow into the engraved regions 16, the top growth portions 121, where the nitride semiconductor thin film grows on the top portions 123 of the ridges 19, become thicker.

As a result, the thickness of the top growth portions 121 on the top portions 123 of the ridges 19 varies within the wafer surface, degrading the flatness of the surface of the nitride semiconductor thin film. Thus, to enhance the flatness, it is necessary to suppress the formation of the nitride semiconductor thin film as a result of atoms and molecules of the source materials from which the nitride semiconductor thin film is formed migrating or otherwise moving from the top growth portions 121 of the ridges 19 into the growth portions 125 or engraved region growth portions 122.

Moreover, it has been found that, when nitride semiconductor laser devices are produced by the technique disclosed in Japanese Patent Application Laid-Open No. 2002-246698 mentioned above, if electrodes are formed in depressions on the surface of the nitride semiconductor growth layer 11, current leak paths develop in the depressions, making it impossible to obtain a normal I-V characteristic. Usually, an insulating film such as $SiO_2$ is formed above depressions, and electrodes are formed further on top. The presence of the depressions here, however, causes the insulating film to be formed unevenly on the surface, leaving a large number of small cracks, very thin regions, small holes (pits), and the like. Thus, through unevenly formed parts of the insulating film, current leaks.

On the other hand, it has also been found that, when individual nitride semiconductor laser devices produced on a nitride semiconductor substrate by the use of the technique disclosed in Japanese Patent Application Laid-Open No. H5-315646 mentioned above are separated from one another, since it is after a nitride semiconductor growth layer is laid on top of the nitride semiconductor substrate that grooves are formed by the use of a dicing machine, the nitride semiconductor growth layer may be internally damaged, degrading the characteristics of the nitride semiconductor laser devices.

SUMMARY OF THE INVENTION

In view of the conventionally encountered problems discussed above, it is an object of the present invention to provide a semiconductor device and a method for the fabrication thereof wherein development of cracks is prevented when a semiconductor device such as a nitride semiconductor laser device is produced by laying a nitride semiconductor growth layer on top of a substrate having a nitride semiconductor layer in at least part of the surface thereof and in addition wherein current leak paths and damage are eliminated by forming a nitride semiconductor growth layer having good surface flatness by suppressing formation of a nitride semiconductor thin film as a result of atoms and molecules of the source materials from which the nitride semiconductor thin film is formed migrating or otherwise moving from top growth portions on the surface of ridges into engraved regions.

To achieve the above object, according to the present invention, a method for fabricating a nitride semiconductor device includes: a first step of forming a processed substrate by forming, on a nitride semiconductor substrate of which at least part of the surface is a nitride semiconductor or on a substrate formed by laying a nitride semiconductor thin film on top of such a nitride semiconductor substrate, an engraved region formed as at least one depressed portion and a ridge portion formed as an non-engraved region; and a second step of laying a nitride semiconductor layer portion consisting of a plurality of nitride semiconductor thin films both on the engraved region and on the surface of the ridge portion formed on the processed substrate. Here, in the first and second steps, let the sectional area of the region surrounded by a sectional portion of the depressed portion cut along the plane perpendicular to the direction in which the depressed portion extends and lines extending from the surface of the ridge portion parallel to the surface of the ridge portion be A, and let the sectional area occupied by the nitride semiconductor thin films laid in the depressed portion be B, then B/A, indicating the degree in which the depressed portion is filled by the nitride semiconductor thin films, is 0.8 or less.

In the above method for fabricating a nitride semiconductor device, advisably, in the first step, in the engraved region, the depressed portion is formed to have an opening width more than 100 μm, and, in the second step, the total thickness from the surface of the ridge portion to the surface of the nitride semiconductor layer portion is 0.8 times the depth of the depressed portion or less.

In the above method for fabricating a nitride semiconductor device, advisably, in the first step, in the engraved region, the depressed portion is formed to have an opening width more than 30 μm but less than or equal to 100 μm, and, in the second step, the total thickness from the surface of the ridge portion to the surface of the nitride semiconductor layer portion is twice the depth of the depressed portion or less.

In the above method for fabricating a nitride semiconductor device, advisably, in the first step, in the engraved region, the depressed portion is formed to have an opening width of 2 μm or more but 30 μm or less, and, in the second step, the total thickness from the surface of the ridge portion to the surface of the nitride semiconductor layer portion is three times the depth of the depressed portion or less.

In the above method for fabricating a nitride semiconductor device, advisably, the method further includes: a third step of forming a plurality of nitride semiconductor devices on top of the substrate by forming, on top of the nitride semiconductor layer portion laid on the surface of the processed substrate in the second step, electrode pads on which to perform wire bonding for connection with outside. Here, in the third step, the electrode pads are not formed above the engraved region.

In the above method for fabricating a nitride semiconductor device, advisably, in the third step, the electrode pads are formed 5 μm or more apart from the edges of the engraved region.

In the above method for fabricating a nitride semiconductor device, advisably, in the first step, the ridge portion has a width of 92 μm or more but 4 mm or less.

In the above method for fabricating a nitride semiconductor device, advisably, one nitride semiconductor device is formed, or a plurality of nitride semiconductor devices are formed, in the ridge portion sandwiched between two adjacent engraved regions.

In the above method for fabricating a nitride semiconductor device, advisably, chip separation is performed by performing scribing on the bottom or top surface of the part of the nitride semiconductor substrate located right below the engraved region of the processed substrate.

In the above method for fabricating a nitride semiconductor device, advisably, the method further includes: a fourth step of cleaving the processed substrate in a direction perpendicular to a first direction in which the engraved region of the nitride semiconductor device extends in order to form bars each having a plurality of nitride semiconductor devices mounted thereon; and a fifth step of performing chip separation by splitting the bars in a direction parallel to the first direction in order to separate the individual nitride semiconductor devices on the bars into discrete chips. Here, in the fifth step, the chip separation is performed after scribing is performed on the top surface of the nitride semiconductor layer portion laid on the engraved region or on the bottom surface of the part of the nitride semiconductor substrate located right below the engraved region so as to form scribe lines parallel to the first direction.

In the above method for fabricating a nitride semiconductor device, advisably, the method includes the fourth and fifth step, and, in the fifth step, the chip separation is performed by performing scribing on the top surface of the nitride semiconductor layer portion laid on the engraved region or on the bottom surface of the part of the nitride semiconductor substrate located right below the engraved region and on the top surface of the nitride semiconductor layer portion laid on the ridge portion or on the bottom surface of the part of the nitride semiconductor substrate located right below the ridge portion.

In the above method for fabricating a nitride semiconductor device, advisably, the method includes the fourth and fifth step, and, in the fifth step, the scribe lines are formed in the shape of solid lines from end to end on each bar.

In the above method for fabricating a nitride semiconductor device, advisably, the method includes the fourth and fifth step, and, in the fifth step, the scribe lines are formed in the shape of solid lines in part of each bar.

In the above method for fabricating a nitride semiconductor device, advisably, the method includes the fourth and fifth step, and, in the fifth step, the scribe lines are formed in the shape of broken lines from end to end on each bar.

In the above method for fabricating a nitride semiconductor device, advisably, the method includes the fourth and fifth step, and, in the fifth step, the scribe lines are formed in an edge portion along the edges formed in the direction perpendicular to the first direction.

According to the present invention, a nitride semiconductor device is fabricated by one of the above-described methods for fabricating a nitride semiconductor device.

Alternatively, according to the present invention, a method for fabricating a semiconductor device includes: a first step of forming a processed substrate by forming, on a substrate having a nitride semiconductor layer in at least part of the surface thereof, an engraved region formed as at least one depressed portion and a ridge portion formed as an non-engraved region. Here, the method further includes: a second step of forming inflow prevention walls as elevated portions along both edges of the ridge portion formed on the processed substrate; and a third step of forming a nitride semiconductor layer portion consisting of at least one type of nitride semiconductor thin film both on the engraved region and on the surface of the ridge portion formed on the processed substrate having the inflow prevention walls formed in the second step so that the nitride semiconductor layer portion is formed on the inflow prevention walls formed along both edges of the ridge portion, and thereby forming inflow prevention portions elevated so as to have a level difference from the surface of the flat portion of the nitride semiconductor layer portion laid on the surface of the ridge portion.

In the above method for fabricating a nitride semiconductor device, advisably, when the nitride semiconductor layer portion is formed in the third step, the depressed portion formed as the engraved region is not completely filled.

In the above method for fabricating a nitride semiconductor device, advisably, in the second step, the inflow prevention walls are formed of one of $SiO_2$, $Al_2O_3$, $TiO_2$, ZrO, and W.

In the above method for fabricating a nitride semiconductor device, advisably, when the inflow prevention walls are formed in the second step, the inflow prevention walls are given a thickness of 50 nm or more but 3 μm or less in the direction normal thereto and thus perpendicular to the surface of the ridge portion.

In the above method for fabricating a nitride semiconductor device, advisably, when the inflow prevention walls are formed in the second step, the inflow prevention walls are given a width of 1 μm or more but 25 μm or less in the direction perpendicular to the length direction of the inflow prevention walls.

In the above method for fabricating a nitride semiconductor device, advisably, the method further includes: a fourth step of forming a plurality of semiconductor devices on top of the substrate by forming, on top of the nitride semiconductor layer portion laid on the surface of the processed substrate having the inflow prevention walls formed in the third step, electrode pads on which to perform wire bonding for connection with outside. Here, in the fourth step, the electrode pads are not formed above the engraved region.

Alternatively, according to the present invention, a method for fabricating a semiconductor device includes: a first step of forming a processed substrate by forming, on a substrate having a nitride semiconductor layer in at least part of the surface thereof, an engraved region formed as at least one depressed portion and a ridge portion formed as an non-engraved region; and a second step of forming a nitride semiconductor layer portion consisting of at least one type of nitride semiconductor thin film both on the engraved region and on the surface of the ridge portion formed on the processed substrate. Here, in the second step, the thickness of the nitride semiconductor layer portion laid in both edge portions of the ridge portion close to the engraved region as measured from the surface of the ridge portion to the surface of the nitride semiconductor layer portion is made greater than the thickness of the nitride semiconductor layer portion laid elsewhere than in both edge portions of the ridge portion as measured from the surface of the ridge portion to the surface of the nitride semiconductor layer portion so as to form inflow prevention portions elevated from the surface of the flat portion of the nitride semiconductor layer portion laid on the surface of the region elsewhere than in both edge portions of the ridge portion.

In the above method for fabricating a nitride semiconductor device, advisably, when the nitride semiconductor layer portion is formed in the second step, the depressed portion formed as the engraved region is not completely filled.

In the above method for fabricating a nitride semiconductor device, advisably, in the second step, the level difference between the surface of the flat portion of the nitride semiconductor layer portion laid on the surface of the ridge portion and the inflow prevention portions elevated therefrom is 150 nm or more.

In the above method for fabricating a nitride semiconductor device, advisably, in the second step, the nitride semiconductor thin film in direct contact with the surface of the processed substrate is 0.5 µm or less thick GaN.

In the above method for fabricating a nitride semiconductor device, advisably, in the second step, the nitride semiconductor thin film in direct contact with the surface of the processed substrate is AlGaN.

In the above method for fabricating a nitride semiconductor device, advisably, in the second step, the nitride semiconductor thin film in direct contact with the surface of the processed substrate is GaN, and, when the GaN is laid on the surface of the processed substrate, the surface of the processed substrate is at a temperature of 1,025°.

In the above method for fabricating a nitride semiconductor device, advisably, in the second step, the nitride semiconductor thin film in direct contact with the surface of the processed substrate is GaN, and, when the GaN is laid, the ratio of the flow rate in mol at which the source material containing nitrogen atoms as a group V element is supplied per unit time to the flow rate in mol at which the source material containing gallium atoms as a group III element is supplied per unit time is 2,000 or more.

In the above method for fabricating a nitride semiconductor device, advisably, in the second step, the nitride semiconductor thin films forming the nitride semiconductor layer portion include an AlGaN layer with an Al content of 0.02.

In the above method for fabricating a nitride semiconductor device, advisably, the method further includes: a fourth step of forming a plurality of semiconductor devices on top of the substrate by forming, on top of the nitride semiconductor layer portion laid on the surface of the processed substrate in the second step, electrode pads on which to perform wire bonding for connection with outside. Here, in the fourth step, the electrode pads are not formed above the engraved region.

In the above method for fabricating a nitride semiconductor device, advisably, in the fourth step, the electrode pads are formed 30 µm or more apart from an edge of the engraved region.

In the above method for fabricating a nitride semiconductor device, advisably, one semiconductor device is formed, or a plurality of semiconductor devices are formed, in the ridge portion sandwiched between two adjacent engraved regions.

In the above method for fabricating a nitride semiconductor device, advisably, chip separation is performed by performing scribing on the top surface of the nitride semiconductor layer portion laid on the engraved region or on the bottom surface of the part of the processed substrate located right below the engraved region.

In the above method for fabricating a nitride semiconductor device, advisably, when the engraved region is formed as the depressed portion in the first step, the depressed portion is given a depth of 1 µm or more but 20 µm or less.

In the above method for fabricating a nitride semiconductor device, advisably, when the engraved region is formed as the depressed portion in the first step, the depressed portion is given an opening width of 1 µm or more.

With any of the above-described methods, it is possible to prevent the engraved region from being filled by the nitride semiconductor thin films, and to prevent different parts of the nitride semiconductor thin films from meeting above the engraved region and forming hollow spaces.

In the above method for fabricating a nitride semiconductor device, advisably, when the engraved region is formed as the depressed portion in the first step, the ridge portion sandwiched between two adjacent engraved regions is given a width of 140 µm or more but 4 mm or less.

According to the present invention, a semiconductor device is fabricated by one of the above-described methods for fabricating a semiconductor device.

BRIEF DESCRIPTION OF THE DRAWINGS

FIG. 1a is a schematic sectional view of the nitride semiconductor laser device of a first embodiment of the invention;

FIG. 1b is a schematic top view of the nitride semiconductor laser device of the first embodiment of the invention;

FIG. 3a is a schematic top view of the processed substrate in the first embodiment of the invention;

FIG. 3b is a schematic sectional view of the processed substrate in the first embodiment of the invention;

FIG. 4a is a schematic sectional view of the processed substrate at an initial stage of growth of the nitride semiconductor thin film in the first embodiment of the invention;

FIG. 4b is a schematic sectional view of the processed substrate at an advanced stage of growth of the nitride semiconductor thin film in the first embodiment of the invention;

FIG. 6a is a schematic sectional view of the processed substrate in a state where the engraved regions are filled by the nitride semiconductor thin film in the first embodiment of the invention;

FIG. 6b is a schematic sectional view of the processed substrate in a state where the engraved regions are filled by the nitride semiconductor thin film in the first embodiment of the invention;

FIG. 6c is a schematic sectional view of the processed substrate in a state where hollow spaces surrounded by the nitride semiconductor thin film are formed in the engraved regions in the first embodiment of the invention;

FIG. 8a is a schematic top view showing the chip separation positions on the nitride semiconductor laser device in the first embodiment of the invention;

FIG. 8b is a schematic sectional view showing the chip separation positions on the nitride semiconductor laser device in the first embodiment of the invention;

FIG. 11a is a schematic sectional view of the nitride semiconductor laser device of a second embodiment of the invention;

FIG. 11b is a schematic top view of the nitride semiconductor laser device of the second embodiment of the invention

FIG. 15a is a partial schematic top view of the nitride semiconductor substrate split into a bar in the second embodiment of the invention;

FIG. 15b is a partial schematic sectional view of the nitride semiconductor substrate split into a bar in the second embodiment of the invention;

DETAILED DESCRIPTION OF PREFERRED EMBODIMENTS

Figure 2A:
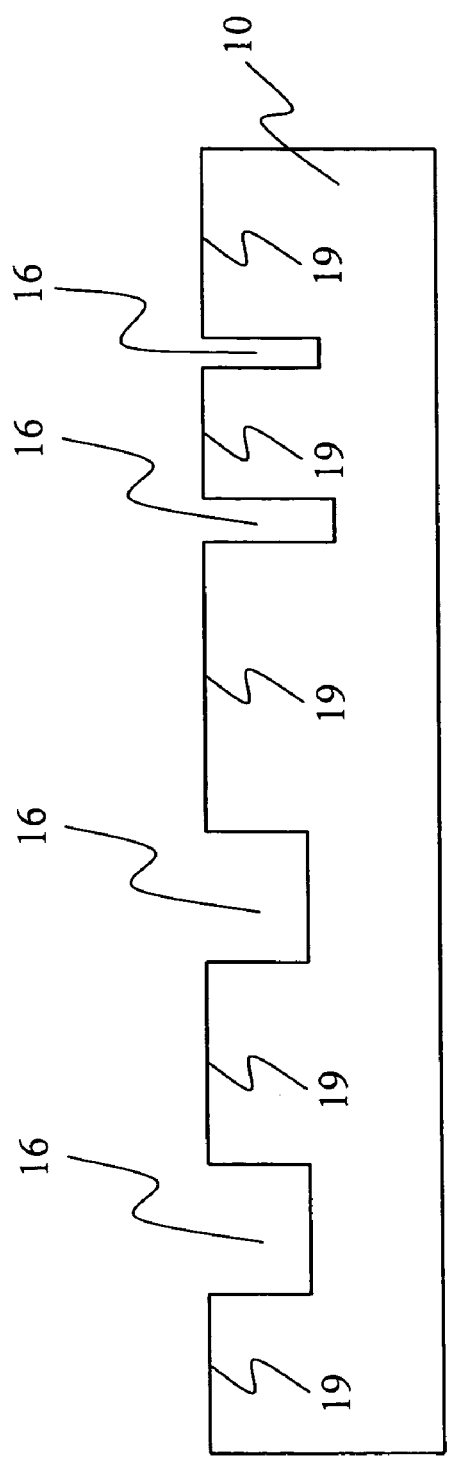
FIG. 2a is a schematic sectional view of a processed substrate having formed thereon engraved regions having rectangular sectional shapes.
Figure 2B:
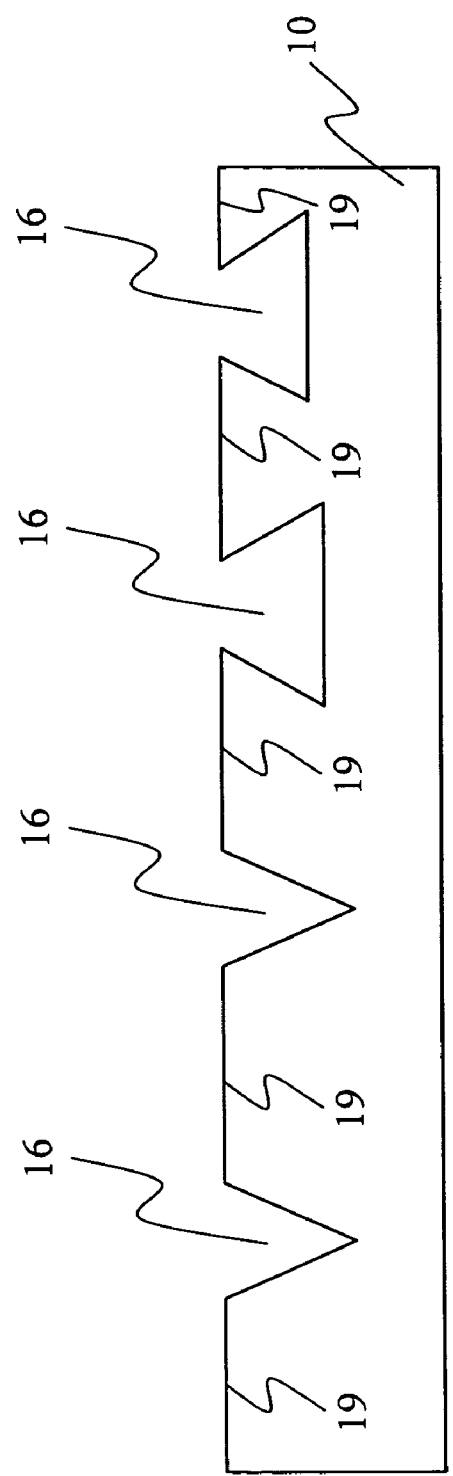
FIG. 2b is a schematic sectional view of a processed substrate having formed thereon engraved regions having triangular and trapezoid sectional shapes.

First, the definitions of some terms that are used in the present specification to convey key concepts will be defined. An "engraved region" denotes a depressed portion formed in the shape of a stripe on the surface of a nitride semiconductor substrate or dissimilar substrate, like those shown in FIGS. 2a and 2b. FIGS. 2a and 2b are schematic sectional views of substrates that have been subjected to engraving so as to have engraved regions 16 and ridges 19 formed thereon. The sectional shape of such engraved regions 16 does not necessarily have to be rectangular, but may be triangular or trapezoid as shown in FIG. 2b; that is, engraved regions 16 have only to be so shaped as to produce level differences between depressed and elevated portions. Each engraved region 16 does not necessarily have to be formed as a single depressed portion, but, as will be described later, may be composed of a plurality of depressed portions and a narrow flat portion sandwiched therebetween.

Likewise, a "ridge" denotes an elevated portion formed in the shape of a stripe. In FIGS. 2a and 2b, the engraved regions 16 and the ridges 19 are formed in a pattern of stripes extending in one direction. The engraved regions 16 or the ridges 19 may also be formed in a pattern of a lattice so that ones extending in different directions cross each other. The engraved regions 16 may be formed to have different shapes, different depths, or different widths on a single substrate. The engraved regions 16 may be formed at varying intervals on a single substrate.

A "nitride semiconductor substrate" denotes a substrate formed of $Al_xGa_yIn_zN$ ($0 \leq x \leq 1$, $0 \leq y \leq 1$, $0 \leq z \leq 1$, and $x+y+z=1$). Here, of the nitrogen element contained in the nitride semiconductor substrate, about 10% or less may be replaced with the element As, P, or Sb (provided that the substrate maintains a hexagonal crystal structure). Moreover, the nitride semiconductor substrate may be doped with Si, O, Cl, S, C, Ge, Zn, Cd, Mg, or Be. Among these doping materials, Si, O, and Cl are particularly suitable in an n-type nitride semiconductor. Suitably used as the orientation of the principal plane of the nitride semiconductor substrate is the C plane {0011}, the A plane {11-20}, the R plane {1-102}, the M plane {1-100}, or the {1-101} plane. So long as the substrate has the principal plane with an off-angle of 2° or less from the orientation of any of those crystal planes, its surface morphology can be satisfactory.

First Embodiment

Figure 19:
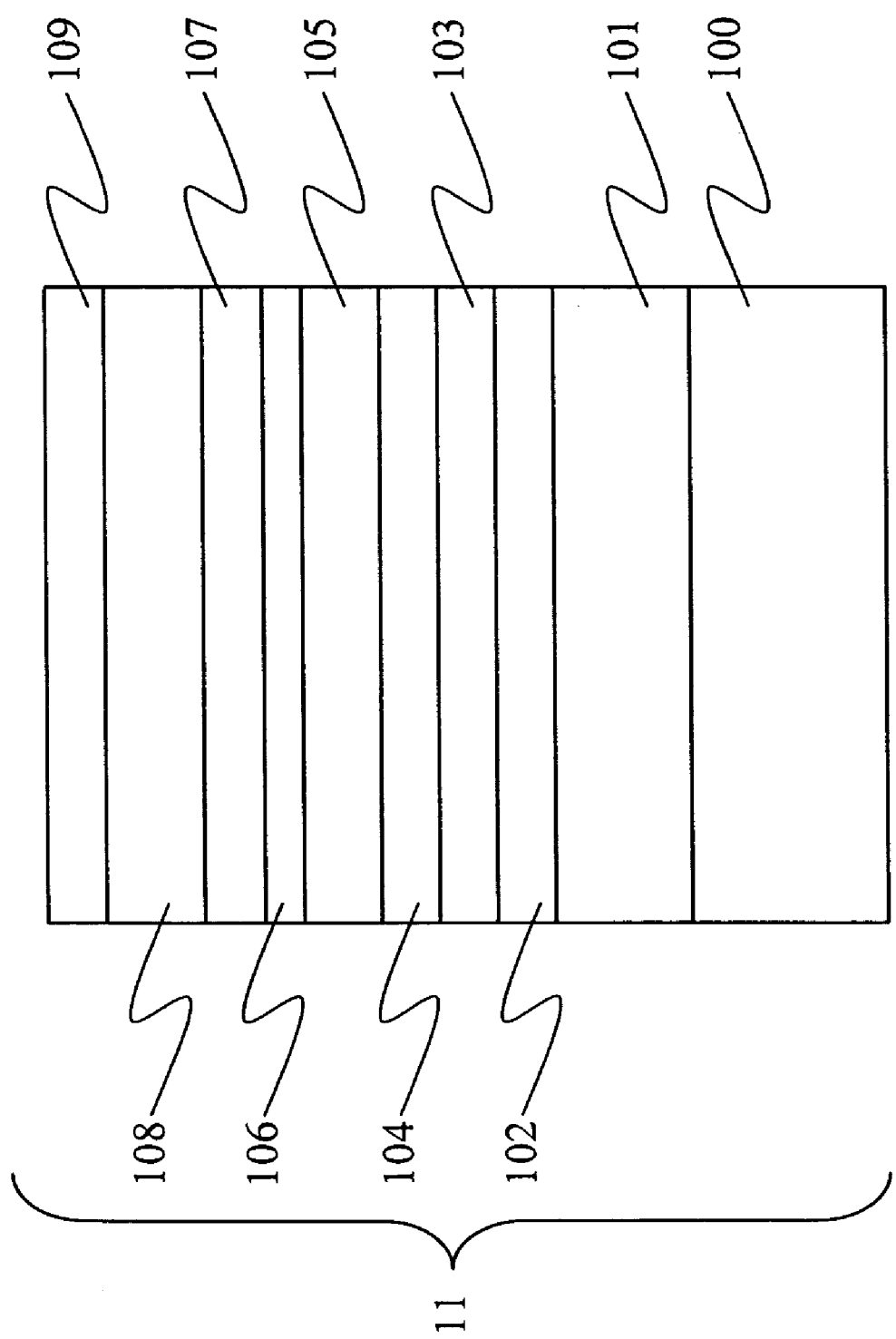
FIG. 19 is a schematic sectional view of a nitride semiconductor growth layer.
Figure 20:
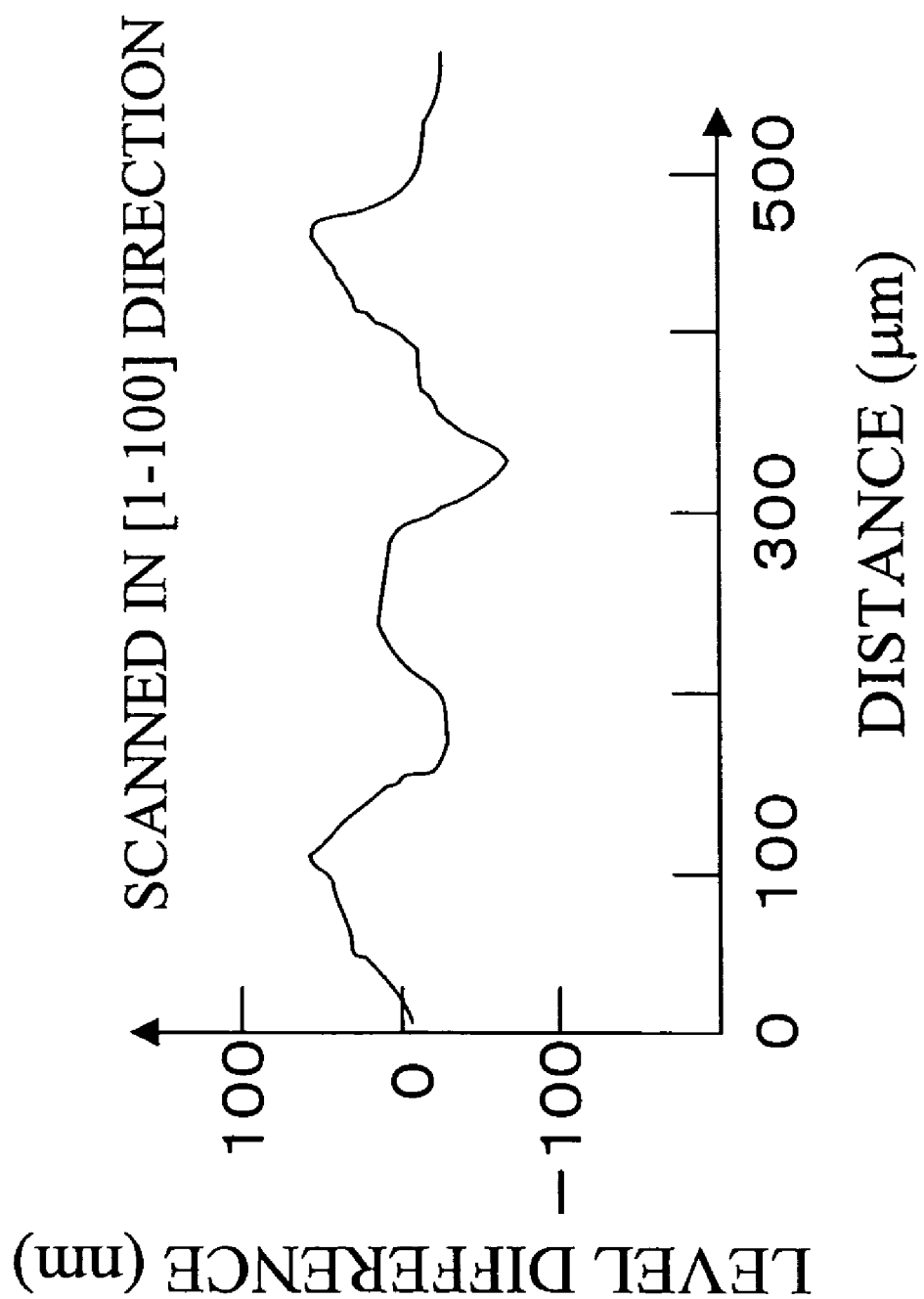
FIG. 20 is a plotting of surface level differences on a conventional wafer having a nitride semiconductor growth layer laid on top of a processed substrate.

Now, a first embodiment of the present invention will be described with reference to the relevant drawings. This embodiment deals with, as an example of a nitride semiconductor device, a nitride semiconductor laser device. It should be understood, however, that the present invention is applicable to any other type of nitride semiconductor device. FIG. 1a is a schematic sectional view of the nitride semiconductor device of this embodiment, and FIG. 1b is a top view of FIG. 1a. FIG. 3b is a schematic sectional view of a processed substrate 10 before a nitride semiconductor thin film is grown thereon in this embodiment of the invention, and FIG. 3a is a top view of FIG. 3b. In these figures, plane orientations are indicated together. The nitride semiconductor laser device shown in FIGS. 1a and 1b is produced, for example, by laying, on top of the processed substrate 10 shown in FIGS. 3a and 3b, a nitride semiconductor growth layer 11 having a structure as shown in FIG. 19.

The nitride semiconductor laser device of this embodiment is produced by growing the nitride semiconductor growth layer 11 on the processed substrate 10 having engraved regions 16 formed as depressed portions thereon. With respect to this nitride semiconductor laser device, first, how the processed substrate 10 is produced will be described with reference to the drawings. In this embodiment, it is assumed that an n-type GaN substrate is used as the processed substrate 10.

First, over the entire surface of the n-type GaN substrate, a 1 μm thick SiO₂ film or the like is sputter-deposited. Subsequently, by a common photolithographic process, a stripe-shaped photoresist pattern is formed in the [1-100] direction so that the resist has 5 μm wide openings and that the distance from the middle of one stripe to the middle of the next stripe in the [11-20] direction (hereinafter, this distance will be referred to as the interval) is 400 μm. Next, by a dry etching technique such as RIE (reactive ion etching), the SiO₂ and the n-type GaN substrate are etched so as to form engraved regions 16 with an engraving depth Y of 5 μm and an opening width X of 5 μm. Thereafter, by using HF (hydrofluoric acid) or the like as an etchant, the SiO₂ is removed. In this way is produced the processed substrate 10 having engraved regions 16 and ridges 19, i.e., non-engraved regions, formed thereon as shown in FIGS. 3a and 3b.

The method by which the above-mentioned SiO₂ is vapor-deposited does not necessarily have to be sputter deposition, but may be electron beam deposition, plasma CVD, or the like. The interval of the resist pattern does not necessarily have to be 400 μm as mentioned above, but may be varied to suit the width of the nitride semiconductor laser device to be produced. The method of etching by which the engraved regions 16 are formed on the processed substrate 10 may be dry etching or wet etching.

The processed substrate 10 may be formed by forming the engraved regions 16 directly on the surface of the n-type GaN substrate as described above, or may be formed by first growing nitride semiconductor thin films of GaN, InGaN, AlGaN, InAlGaN, and the like on the surface of the n-type GaN substrate and then performing engraving.

On top of the processed substrate 10 produced as described above, by appropriately using a well-known technique such as MOCVD, a nitride semiconductor growth layer 11 as shown in FIG. 19 is epitaxially grown to produce the nitride semiconductor laser device shown in FIGS. 1a and 1b.

Thus, the nitride semiconductor laser device shown in FIGS. 1a and 1b has the nitride semiconductor growth layer 11, having a plurality of nitride semiconductor thin films laid on top of one another as shown in FIG. 19, formed on top of the processed substrate 10, having the engraved region 16, produced as described above. Moreover, on the surface of the nitride semiconductor growth layer 11, there are formed a laser stripe 12 that serves as a laser light waveguide and a SiO₂ film 13 that is laid to sandwich the laser stripe 12 and that serves for current constriction. On the surface of the laser stripe 12 and the SiO₂ film 13, a p-side electrode 14 is formed. On the other hand, on the bottom surface of the processed substrate 10, an n-side electrode 15 is formed. Moreover, the part of the surface of the p-side electrode 14 located right above the laser stripe 12 is formed into an elevated stripe 18.

Figure 7A:
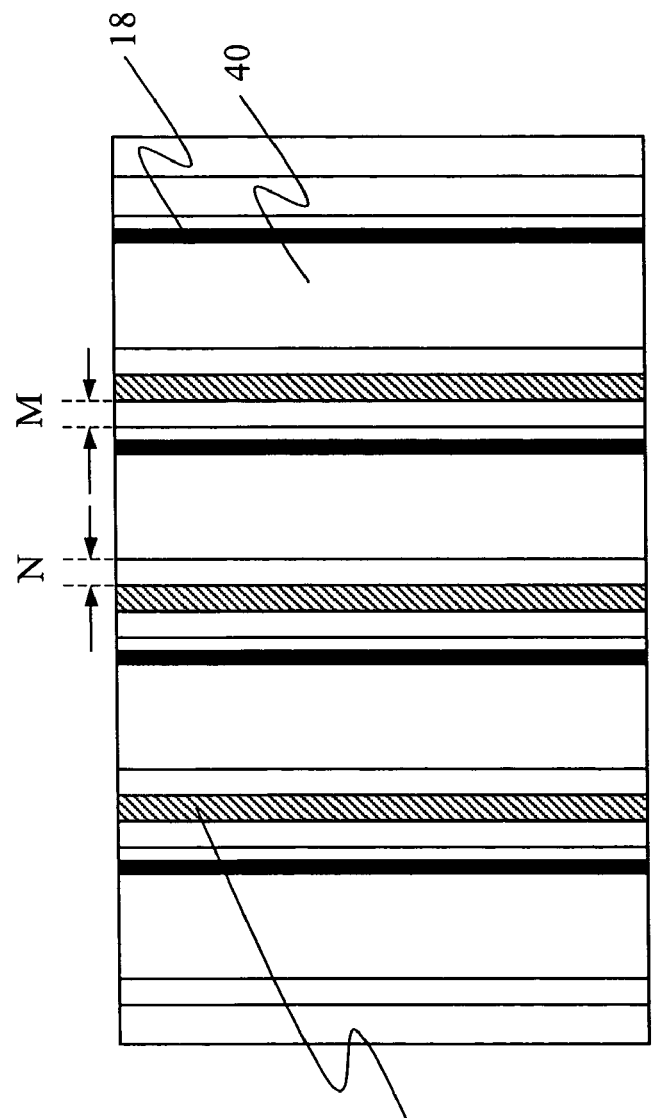
FIG. 7a is a partial schematic top view of the nitride semiconductor substrate split into a bar in the first embodiment of the invention.
Figure 7B:
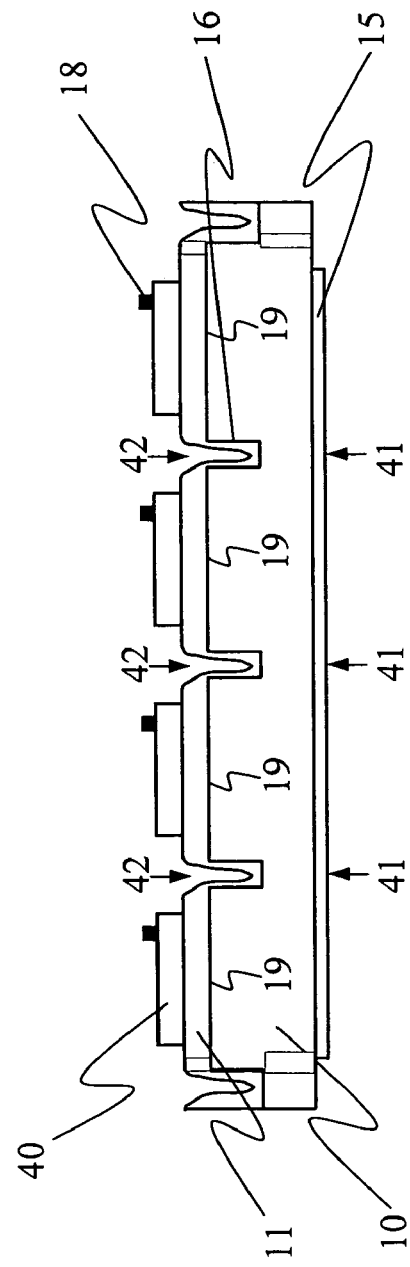
FIG. 7b is a partial schematic sectional view of the nitride semiconductor substrate split into a bar in the first embodiment of the invention.

The nitride semiconductor laser device having a ridge structure as described above is produced, after forming a nitride semiconductor growth layer 11 on top of a processed substrate 10, by appropriately using well-known techniques. In this regard, therefore, no detailed description will be given. Then, a plurality of nitride semiconductor laser devices formed as a result of the nitride semiconductor growth layer 11 being laid on top of the processed substrate 10 (wafer) are separated into discrete devices. Specifically, first, the wafer is cleaved in the direction parallel to the [11-20] direction (see FIGS. 1a and 1b) so as to be split into bars each having a plurality of nitride semiconductor laser devices as shown in FIGS. 7a and 7b. Here, in this embodiment, the resonator length, i.e., the length in the direction of the resonator (i.e., the [1-100] direction), is 600 μm. The resonator length, however, does not necessarily have to be equal to that value, but may be any value preferably in the range from 300 μm to 1,200 μm. The bars thus split are then split into chips to separate the individual nitride semiconductor laser devices from one another. How chip separation is performed here will be described later.

The nitride semiconductor laser device shown in FIGS. 1a and 1b is produced as described above. Here, let the distance from the middle of the laser stripe 12 to the edge of the engraved region 16 be "d". In this embodiment, it is assumed that d=40 μm. It should be noted that, for easy understanding of the sectional structure, FIGS. 1a and 1b show a section of a nitride semiconductor laser device produced by performing chip separation at positions different from engraved regions at which chip separation is actually performed as will be described later.

In the nitride semiconductor laser device shown in FIGS. 1a and 1b, the p-side electrode 14 is formed of, from the side thereof closer to the nitride semiconductor growth layer 11, Mo/Au, Mo/Pt/Au, a single Au layer, or the like. In this embodiment, a SiO₂ film 13 is used as an insulating film for current constriction. Instead, it is possible to use ZrO, TiO₂, or the like as the material for the insulating film.

In this nitride semiconductor laser device, how the nitride semiconductor thin films grow in the engraved regions 16 and the flatness of the nitride semiconductor thin films grown on the ridges have a correlation as described below.

When epitaxial growth is started on the processed substrate 20 having the engraved regions 16 formed thereon, as shown in FIG. 4a, nitride semiconductor thin films grow as top growth portions 21 on top portions 23 of the ridges and as engraved region growth portions 22 on side portions 24 and floor portions 25 in the engraved regions 16. Let the opening width and depth of the engraved regions 16 formed on the processed substrate 20 before the nitride semiconductor thin films are grown be X and Y, respectively. Moreover, it is assumed that lines extended from the surfaces of the top portions 23 of the ridges parallel thereto form engraved region boundary lines 26. Here, in the engraved regions 16, let the sectional area of the portions surrounded by the side portions 24, the floor portions 25, and the engraved region boundary lines 26 be A. Thus, the sectional area A equals X×Y.

At an initial stage of epitaxial growth, as shown in FIG. 4a, the top growth portions 21 formed by the nitride semiconductor thin films grown on the surface of the top portions 23 of the ridges are separate from the engraved region growth portions 22 formed by the nitride semiconductor thin films grown on the top portions 23 and the floor portions 25 in the engraved regions 16. As the growth of the nitride semiconductor thin films progresses, as shown in FIG. 4b, the top growth portions 21 grown on the top portions 23 couple, via growth portions 27, to the engraved region growth portions 22 grown in the engraved regions 16. Let the sectional area of the engraved region growth portions 22 grown in the engraved regions 16 in this way be B, and let the ratio of the sectional area B to the above-mentioned sectional area A be C. This ratio is used to express the degree in which the engraved regions 16 is filled by the nitride semiconductor thin films.

The degree of filling C is assumed to be 100% when, for example as shown in FIG. 6a, the nitride semiconductor thin films are laid in the engraved regions 16 until the latter is completely filled by, the former, irrespective of whether the surface of the nitride semiconductor thin films thus grown is flat or not. On the other hand, in cases where, as shown in FIG. 6b, the engraved regions 16 is not completely filled by the nitride semiconductor thin films laid therein (i.e., the engraved region growth portions 22), the degree of filling C is calculated by the above-described calculation method such that C=(B/A)×100. By contrast, in cases where, as shown in FIG. 6c, the top portions 21 grow laterally so fast that, while hollow spaces 31 still remain in the engraved regions 16, different parts of the nitride semiconductor thin films (i.e., the top growth portions 21) meet above those hollow spaces 31, the nitride semiconductor thin films come to have poor surface flatness, contributing little to the reduction of cracks. Thus, the just mentioned cases are not considered in this embodiment.

Figure 5:
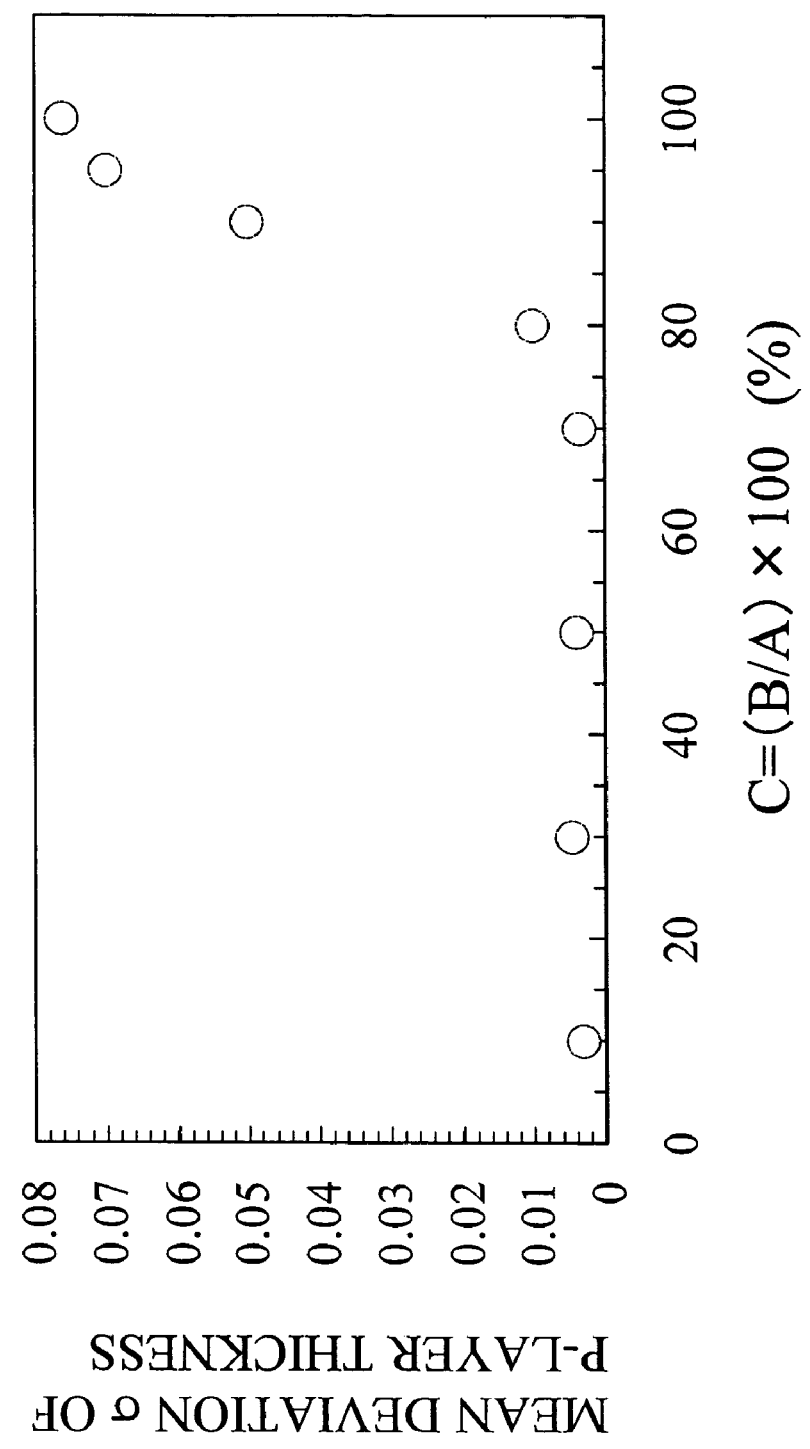
FIG. 5 is a diagram showing the correlation between the degree of filling C and the mean deviation σ of the p-layer thickness in the first embodiment of the invention.

Flatness is evaluated in the following manner. The wafer produced by laying the nitride semiconductor growth layer 11 composed of a plurality of nitride semiconductor thin films on the processed substrate 10 having the engraved regions 16 formed thereon as shown in FIGS. 1a and 1b was inspected under an optical interference microscope to measure the p-layer thickness before the etching for forming the ridge structure. The variation of the p-layer thickness within the wafer surface was used as the indicator of flatness. Specifically, with the design value of the p-layer thickness assumed to be 0.670 μm, the p-layer thickness was measured at 20 spots within the wafer surface, and the mean deviation σ of the measurements thus taken was calculated. This mean deviation σ indicates the degree of variation among the thicknesses measured at the 20 spots. The greater the mean deviation σ, the greater the variation of the various characteristics of nitride semiconductor laser devices such as their FFP, threshold current, slope efficiency, etc. To suppress the variation of the characteristics of nitride semiconductor laser devices, the mean deviation a needs to be reduced to 0.01 or less. Incidentally, the mean deviation σ is calculated by dividing by 20 the sum of the absolute values of the differences between each of the thicknesses measured at the 20 spots and the mean value of those 20 measurements, FIG. 5 shows the relationship between the degree of filling C of the engraved regions 16 by the nitride semiconductor thin films and the degree of variation of the p-layer thickness before the etching for forming the ridge structure. The graph of FIG. 5 shows the following. With the degree of filling C greater than 80%, the mean deviation σ of the p-layer thickness abruptly increases; with the degree of filling C at 80% or less, the mean deviation σ of the p-layer thickness remains small. For example, when nitride semiconductor laser devices were produced with the degree of filling C at 70%, the mean deviation σ of the p-layer thickness was 0.0034 μm, an excellent result.

The degree of filling C of the engraved regions 16 can be reduced to 80% or less, for example, by controlling the total thickness of the nitride semiconductor thin films, or by controlling the opening width X and depth Y of the engraved regions 16. Here, the total thickness of the nitride semiconductor thin films (hereinafter simply the total thickness) denotes, in the processed substrate 10 having the engraved regions 16 formed thereon, the thickness from the surface of the part thereof where the engraved regions 16 are not formed to the surface of the nitride semiconductor growth layer 11 formed by laying various nitride semiconductor thin films on top of one another. That is, it denotes, after the formation of the laser stripe 12 (see FIG. 1a), the thickness from the surface of the part of the processed substrate 10 where the engraved regions 16 are not formed to the surface of the laser stripe 12 on the nitride semiconductor growth layer 11. Here, the $SiO_2$ film 13 and the p-side electrode 14 are not included.

To obtain good film flatness, when the opening width X of the engraved regions 16 is more than 100 μm, the engraved region growth portions 22 that grow on the floor portions 25 of the engraved regions 16 grow at the same growth rate, and thus come to have the same thickness, as the top growth portions 21 that grow on the surface of the top portions 23 of the ridges where the engraved regions 16 are not formed. Thus, when the total thickness is 0.8 times the depth Y of the engraved regions 16 or less, the degree of filling C of the engraved regions 16 is 80% or less.

When the opening width X of the engraved regions 16 is 2 μm or more but 30 μm or less, the openings of the engraved regions 16 is so narrow that atoms and molecules of the source materials of the nitride semiconductor thin films cannot sufficiently enter the engraved regions 16. Thus, the engraved region growth portions 22 that grow on the floor portions 25 of the engraved regions 16 grow at a lower growth rate, and thus come to have a smaller thickness, than the growth rate at which the top growth portions 21 that grow on the surface of the top portions 23 of the ridges where the engraved regions 16 are not formed. Thus, when the total thickness is 3 times the depth Y of the engraved regions 16 or less, the degree of filling C of the engraved regions 16 is 80% or less.

When the opening width X of the engraved regions 16 is more than 30 μm but less than or equal to 100 μm, the value of X falls between the two ranges mentioned above, and thus, when the total thickness is twice the depth Y of the engraved regions 16 or less, the degree of filling C of the engraved regions 16 is 80% or less. Incidentally, if the opening width X of the engraved regions 16 is less than 2 μm, an undesirable state as the one shown in FIG. 6c results. Accordingly, in this embodiment, the opening width X of the engraved regions 16 is assumed to be 2 μm or more.

Also evaluated were cracks formed when the nitride semiconductor growth layer 11 composed of various nitride semiconductor thin films was laid on top of the processed substrate 10 having the engraved regions 16 formed thereon as described above. The results were as follows. When the degree of filling C was 80% or less, the density of cracks in the film was 0 cracks/cm$^2$; when the degree of filling C was 80% or more, the density of cracks in the film was 3 to 4 cracks/cm$^2$; and, when the degree of filling C was 100%, the density of cracks in the film was about 10 cracks/cm$^2$. That is, by reducing the degree of filling C to 80% or less, it is possible to produce nitride semiconductor laser devices with reduced variations in the p-layer thickness, with good flatness in the nitride semiconductor thin films, and with reduced development of cracks.

The thus produced nitride semiconductor laser devices are then separated into discrete chips. Prior to chip separation, first, the wafer is cleaved to form resonator end faces. Now, how this is done will be described with reference to the drawings. FIG. 7b shows part of a schematic sectional view of a wafer cleaved in the direction parallel to the [11-20] direction (see FIGS. 1a and 1b) so as to be split into a bar with resonator end faces formed at the cleavage surfaces, and FIG. 7a is a top view thereof.

On top of the processed substrate 10 having the engraved regions 16 formed thereon, the nitride semiconductor growth layer 11 is laid, on the surface of which are formed p-side electrode pads 40 each composed of an insulating film such as a SiO$_2$ film 13 and a p-side electrode 14 (see FIG. 1a). On these p-side electrode pads 40, wire bonding is performed. The p-side electrode pads 40 are typically about 100 nm to 1 μm thick. The nitride semiconductor growth layer 11 has a current constriction layer inside, and, in an "embedded current constriction laser" that performs current constriction with that layer, the p-side electrode pads 40 are each composed solely of a p-side electrode 14. Moreover, on the top surfaces of the p-side electrode pads 40, elevated stripes 18 are formed, and, on the bottom surface of the processed substrate 10, an n-side electrode 15 is formed. As shown in FIG. 7a, let the distances from both edges of the p-side electrode pad 40 to the edges of the engraved regions 16 adjacent respectively to those edges of the p-side electrode pad 40 be M and N, respectively.

As shown in FIGS. 7a and 7b, the p-side electrode pads 40 are not formed above the engraved regions 16. This is because, since the surface of the nitride semiconductor growth layer 11 is not flat above the engraved regions 16, forming an insulating film such as SiO$_2$ on the surface there results in producing cracks, through dislocations, holes, locally thinner parts, etc. These regions, as compared with the regions elsewhere than above the engraved regions 16, exhibit low electrical insulation and cause current leakage.

Moreover, even if, when the engraved regions 16 are completely filled, no grooves or depressions are recognized visually, in the process of the engraved regions 16 becoming filled by the nitride semiconductor thin films laid therein, the nitride semiconductor thin films in the engraved regions 16 develop defects, dislocations, cracks, etc. Thus, forming SiO$_2$ or the like on the surface of the nitride semiconductor growth layer 11 above the engraved regions 16 results in low electrical insulation. As a result, if the p-side electrode pads 40 are formed above the engraved regions 16 or depressions, there may be observed spontaneous emission light in those regions. This spontaneous emission light is produced when a leak current flows through a nitride semiconductor laser device. When the p-side electrode pads 40 were formed 5 μm or more apart from the edges of the engraved regions 16, no spontaneous emission light was observed elsewhere than from the regions of the laser stripes 12 (see FIG. 1a). Hence, it is preferable that the distances M and N from the edges of the engraved regions 16 to both edges of the p-side electrode pads 40 be both 5 μm or more.

This embodiment deals with a ridge-stripe-type laser that achieves current constriction by the use of an insulating film such as SiO$_2$ formed on top of a nitride semiconductor growth layer 11, but may be applied to any other type of laser as well, such as a VSIS (V-channeled substrate inner stripe) type laser having a current constriction layer inside a nitride semiconductor growth layer 11. In this type of laser, there is no insulating film for current constriction on the surface of the nitride semiconductor growth layer 11, and the p-side electrode pad 40 is composed solely of a p-side electrode 14. It should be noted that, in the present specification, an electrode pad denotes an electrode pad on an insulating surface or an electrode itself. Also in this type of laser, when the p-side electrode pad 40 was formed in the engraved region 16, as in a ridge-stripe-type laser, a large leak current flowed, degrading the characteristics of the nitride semiconductor laser device and causing it to fail to lase. This is considered to result from degraded crystallinity of the current constriction layer located above the engraved region 16. Thus, also in lasers of the VSIS type and the like, it is preferable that the distances M and N from the edges of the engraved regions 16 to both edges of the p-side electrode pads 40 be both 5 μm or more.

This embodiment deals with a structure in which an n-type GaN substrate is used as the processed substrate 10 and the electrode pad formed on the surface of the nitride semiconductor growth layer 11 is a p-side electrode pad, but may be applied to any other structure; for example, it may also be applied to a nitride semiconductor laser device so structured that the processed substrate 10 is formed of a p-type semiconductor material, the surface of the nitride semiconductor growth layer 11 is formed of an n-type nitride semiconductor thin film, and the electrode pad formed on the surface thereof is an n-type electrode pad.

When wire bonding is performed, though depending on the structure of the nitride semiconductor laser device, the diameter of the ball portion at the tip of the wire is typically about 80 μm, and accordingly the p-side electrode pads 40 need to be 80 μm or more wide. Thus, the interval T of the engraved regions 16 needs to fulfill the formula T≧[the opening width X (2 μm or more) of the engraved regions 16+ the width (80 μm or more) of the p-side electrode pads 40+10 μm (the minimum value of the sum of the distances M and N from both edges of the p-side electrode pads 40 to the edges of the engraved regions 16)]. When T is greater than 4 mm, cracks are likely to develop within the nitride semiconductor thin films laid. Thus, it is preferable that the interval T of the engraved regions 16 be 4 mm or less. Hence, it is preferable that the interval T of the engraved regions 16 be 92 μm or more but 4 mm or less.

The plurality of nitride semiconductor laser devices produced on the processed substrate 10 split into a bar as shown in FIGS. 7a and 7b are then separated into discrete chips. Now, how chip separation is achieved will be described with reference to the drawings.

In FIG. 7b, chip separation positions 41 and 42 are indicated. At the chip separation positions 41 and 42, either from the n-side electrode 15 side or from the nitride semiconductor growth layer 11 side, scribing is perform by the use of a diamond pen or the like. Then, with a blade having an acute-angled edge placed against the scribed lines (hereinafter the scribe lines), pressure is applied to the blade by the use of a breaking machine so that the bar is split under the pressure. It is preferable that the scribe lines run along the middles of the engraved regions 16. In this embodiment, however, as described above, the degree of filling C of the engraved regions 16 is 80% or less, and thus the engraved regions 16 are not completely filled, with grooves left, which serve as guides in chip separation. Thus, even if the scribe lines are located off the middles of the engraved regions 16, so long as they run within the engraved regions 16, there is no risk of chipping or separation in an unintended direction.

Even if the scribe lines run outside the engraved regions 16 and, during chip separation, splitting proceeds off the scribe lines, i.e., in an unintended direction, once the splitting reaches the engraved regions 16, it then proceeds along the grooves inside the engraved regions 16. Thus, the neighboring nitride semiconductor laser devices are saved from destruction. The reason that splitting does not proceed out of the engraved regions 16 is considered to be that the crystallinity, plane orientation, and other properties of the nitride semiconductor thin films laid in the engraved regions 16 differ from those of the nitride semiconductor thin films grown on the flat portions on the non-engraved regions.

In this embodiment, as shown in FIGS. 7a and 7b, it is preferable that one nitride semiconductor laser device be produced on each ridge, i.e., the non-engraved region between two adjacent engraved regions. It is, however, also possible to adopt any other structure, for example one in which two or more nitride semiconductor laser devices are produced on each ridge, i.e., the non-engraved region between two adjacent engraved regions.

Scribing may be performed, as shown in FIGS. 8a and 8b, at the chip separation positions 52 and 53 but only in a resonator end face side edge portion of the engraved regions 16 so that scribe lines 50 are formed only in that edge portion. The scribe lines may be formed as broken line scribe lines 51. Even when scribing is performed in this way, it is possible to perform chip separation at a good yield. The scribe lines may be formed as solid lines (not illustrated).

Figure 9:
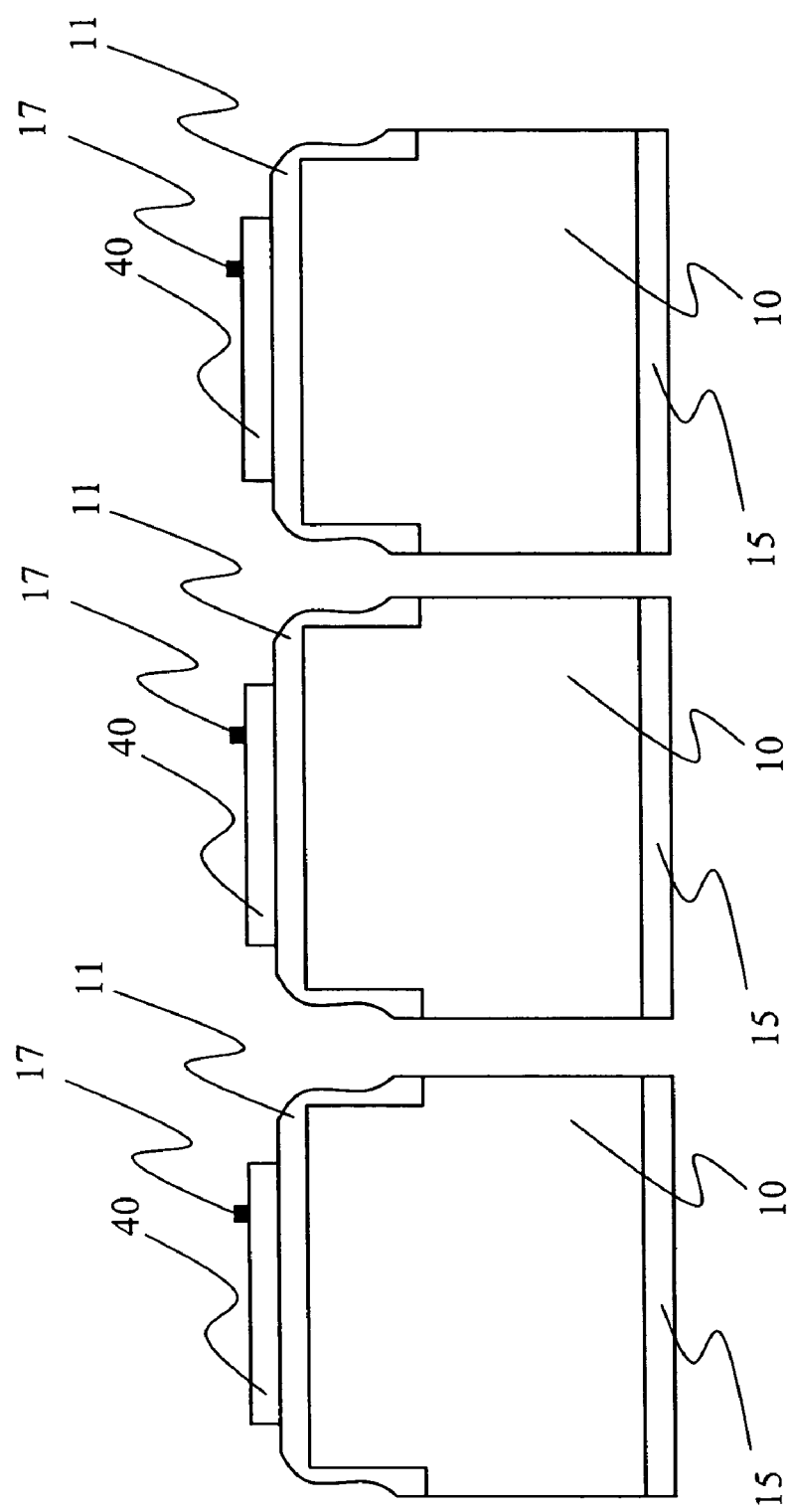
FIG. 9 is a schematic sectional view of the nitride semiconductor laser device split into discrete chips in the first embodiment of the invention.

Through the chip separation performed as described above, discrete nitride semiconductor laser devices are obtained as shown in FIG. 9. In this embodiment, chip separation is performed by exploiting the grooves formed in the engraved regions 16 as a result of the engraved regions 16 being incompletely filled by the nitride semiconductor thin films laid therein. This method, as compared with the conventional method whereby grooves for chip separation are newly formed in the chip separation step, reduces the damage to the nitride semiconductor thin films, prevents degradation of the characteristics of nitride semiconductor laser device, and permits chip separation at a good yield.

Figures 10A, 10B:
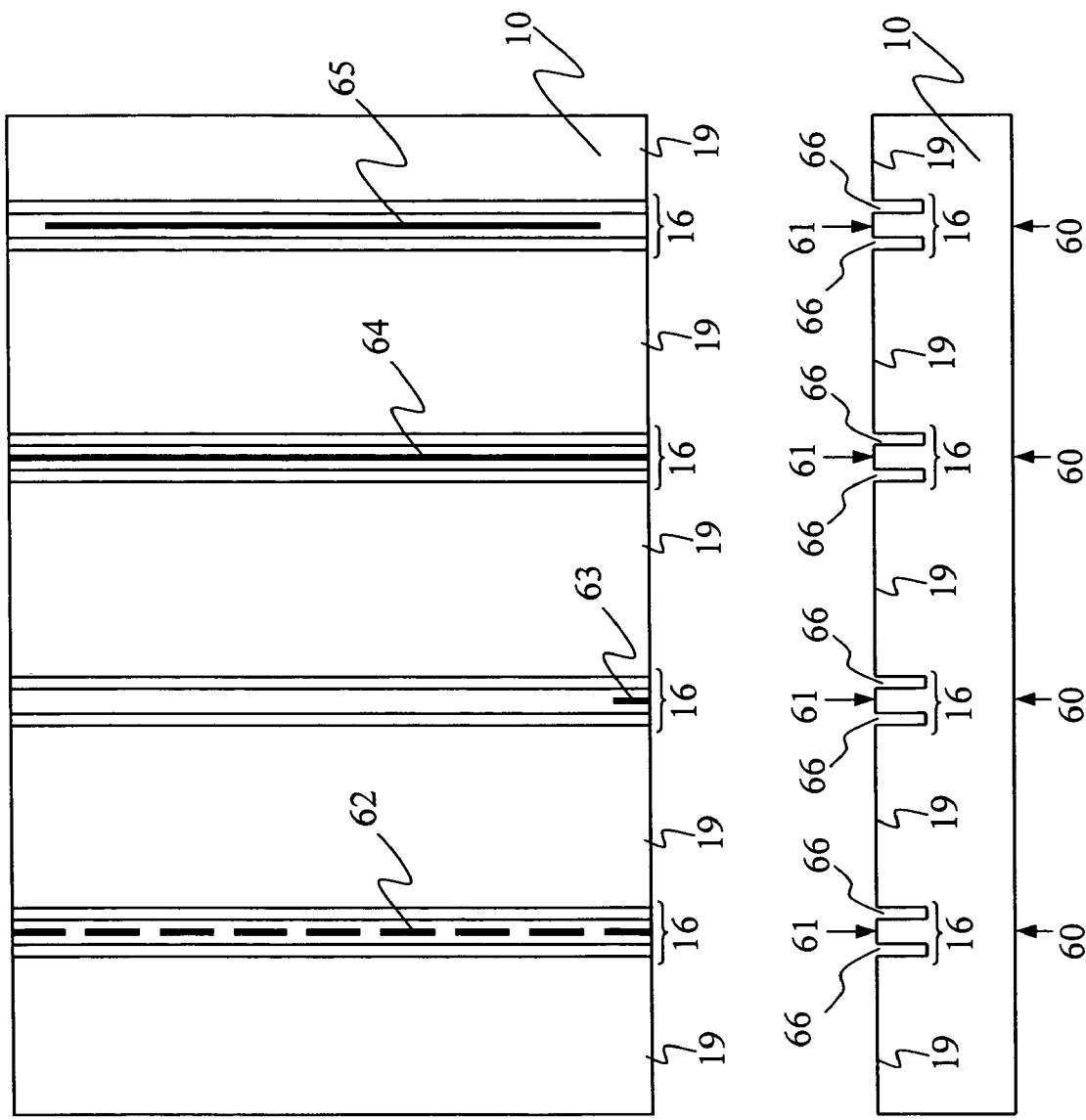
FIG. 10a is a schematic top view showing the chip separation positions on the nitride semiconductor laser device in another example of the first embodiment of the invention.
FIG. 10b is a schematic sectional view showing the chip separation positions on the nitride semiconductor laser device in another example of in the first embodiment of the invention.

Alternatively, as shown in FIGS. 10a and 10b, chip separation may be performed by forming two stripe-shaped depressed portions 66 and then scribing, in the flat region sandwiched between those two stripes, the bottom surface or the nitride semiconductor growth layer 11 (see FIG. 1a) side surface of the wafer. With this structure, during chip separation, even if splitting proceeds in an unintended direction, the depressed portions 66 on both sides prevent the splitting from proceeding beyond them, and thus save the neighboring nitride semiconductor laser devices from destruction. Thus, without the need to perform scribing at the depressed portions 66, by performing scribing in the flat region sandwiched between the depressed portions 66 as indicated by chip separation positions 60 and 61 in FIG. 10b, it is possible to perform chip separation at a good yield. The scribing lines formed may be, as shown in FIG. 10a, broken-line scribe lines 62, or scribe lines 63 formed by performing scribing only in a resonator end face side edge portion, or solid-line scribe lines 64, or solid-line scribe lines 65 leaving unscribed portions.

Second Embodiment

Figures 12A, 12B:
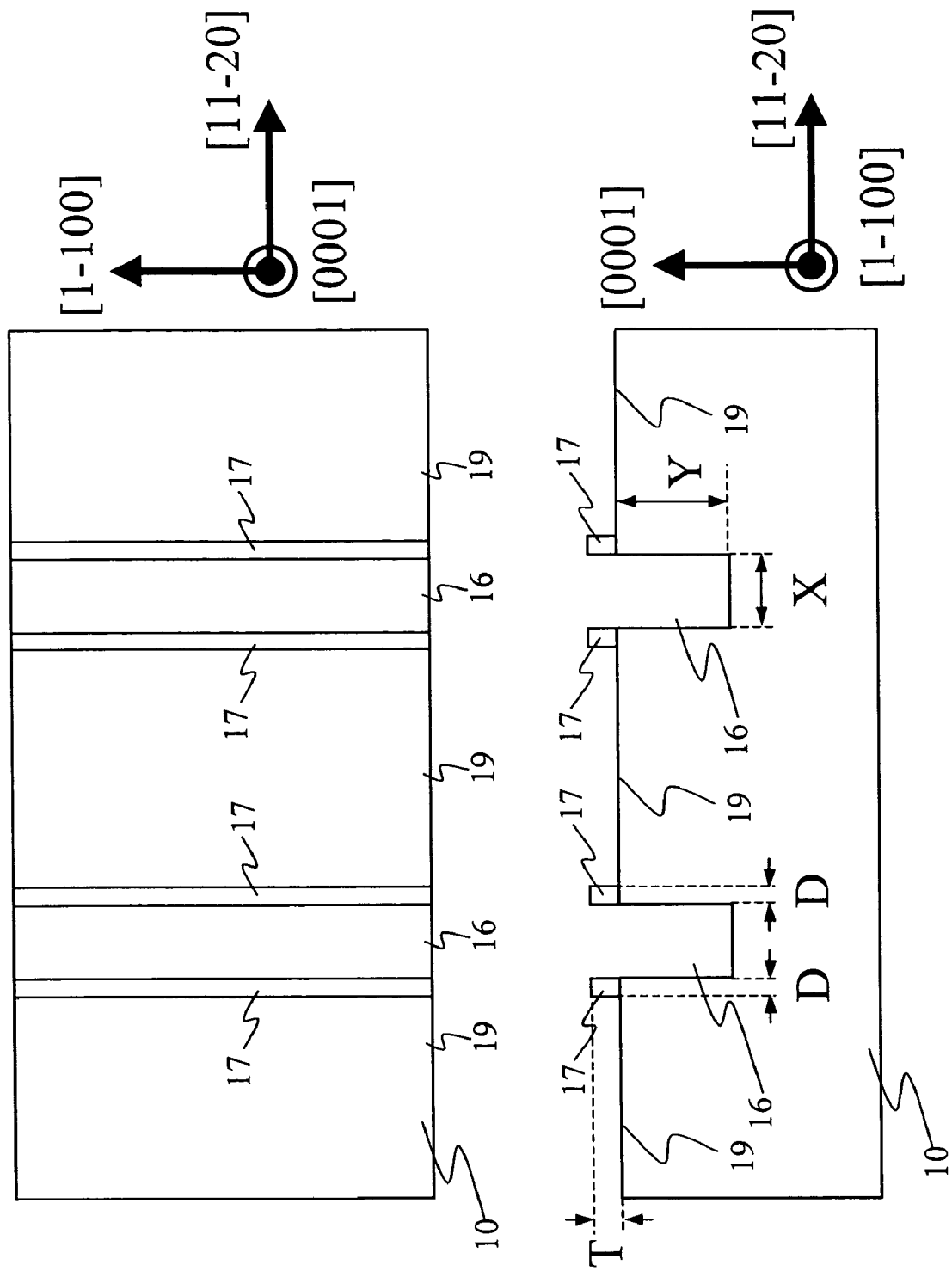
FIG. 12a is a schematic top view of the processed substrate in the second embodiment of the invention.
FIG. 12b is a schematic sectional view of the processed substrate in the second embodiment of the invention.

Next, a second embodiment of the present invention will be described with reference to the relevant drawings. This and the following embodiments both deal with, as an example of a semiconductor device, a nitride semiconductor laser device. It should be understood, however, that the present invention is applicable to any other type of semiconductor device. FIG. 11a is a schematic sectional view of the semiconductor device of this embodiment, and FIG. 11b is a top view of FIG. 11a. FIG. 12b is a schematic sectional view of a processed substrate 10 before a nitride semiconductor thin film is grown thereon in this embodiment of the invention, and FIG. 12a is a top view of FIG. 12b. In FIGS. 11a, 11b, 12a, and 12b, plane orientations are indicated together.

In the nitride semiconductor laser device of this embodiment, a processed substrate 10 formed of a nitride semiconductor substrate having engraved regions 16 formed as depressed portions thereon further has SiO$_2$ walls formed in the shape of stripes extending in the [1-100] direction along both edges of a ridge 19, i.e., the non-engraved region. On top of this processed substrate 10, a nitride semiconductor growth layer 11 is grown, and thereby the nitride semiconductor laser device is produced. With respect to this nitride semiconductor laser device, first, how the processed substrate 10 is produced will be described with reference to the drawings. In this embodiment, it is assumed that an n-type GaN substrate is used as the processed substrate 10.

First, over the entire surface of the n-type GaN substrate, a 1 μm thick SiO$_2$ film or the like is sputter-deposited. Subsequently, by a common photolithographic process, a stripe-shaped photoresist pattern is formed in the [1-100] direction so that the resist has 5 μm wide openings and that the interval from the middle of one stripe to the middle of the next stripe in the [11-20] direction is 250 μm. Next, by a dry etching technique such as RIE (reactive ion etching), the SiO$_2$ and the n-type GaN substrate are etched so as to form engraved regions 16 with an engraving depth Y of 5 μm and an opening width X of 5 μm. Thereafter, by using HF (hydrofluoric acid) or the like as an etchant, the SiO$_2$ is removed. In this way is produced the processed substrate 10 having engraved regions 16 and ridges 19 formed thereon.

In this embodiment, the SiO$_2$ film is formed on the surface of the n-type GaN substrate by vapor-depositing SiO$_2$ thereon. Instead, any other type of dielectric film or the like may be formed on the surface of the n-type GaN substrate. The method by which the above-mentioned SiO$_2$ is formed does not necessarily have to be sputter deposition, but may be electron beam deposition, plasma CVD, or the like. The interval of the resist pattern does not necessarily have to be 250 μm as mentioned above, but may be varied to suit the width of the nitride semiconductor laser device to be produced. In this embodiment, the engraved regions 16 are formed by dry etching. Instead, the engraved regions 16 may be formed by wet etching or the like.

The processed substrate 10 produced in this way may be formed by forming engraved regions 16 directly on the surface of an n-type GaN substrate as described above, or may be formed by first growing nitride semiconductor thin films of GaN, InGaN, AlGaN, InAlGaN, and the like on the surface of an n-type GaN substrate, or a nitride semiconductor substrate other than an n-type GaN substrate, or on a dissimilar substrate, and then performing engraving.

After the processed substrate 10 having the engraved regions 16 formed thereon is formed in this way, $SiO_2$ is vapor-deposited on the ridges 19, i.e., the non-engraved regions, to form a $SiO_2$ film. Subsequently, along both edges of the ridges 19, by a common photolithography technique, a stripe-shaped resist pattern is formed with a width of D in the [1-100] direction. Here, the resist pattern is formed in such a way that lines extended from the side faces of the engraved regions 16 coincide with the side wall surfaces of the resist pattern. Then, by dry etching or by wet etching using HF (hydrofluoric acid) or the like, the $SiO_2$ film is etched until the surface of the n-type GaN substrate is exposed. In this way is produced the processed substrate 10 on which are formed, as shown in FIG. 12a and 12b, as well as engraved regions 16 and ridges 19, stripe-shaped $SiO_2$ walls 17 having a width of D and a thickness of T and extending in the [1-100] direction along both edges of the ridges 19.

In this embodiment, the $SiO_2$ walls 17 are formed of $SiO_2$. Instead, the walls may be formed of any material other than $SiO_2$, such as $Al_2O_3$, $TiO_2$, ZrO, or W. Any material such as $Al_2O_3$, $TiO_2$, ZrO, or W is selective in the sense that, when a film of GaN or AlGaN is attempted to be formed on its surface, the growth of GaN or AlGaN is either slow or nonexistent altogether. When walls of such a selective material are formed along both edges of the ridges 19, they prevent atoms and molecules of the source material of GaN or AlGaN from flowing into the engraved regions 16. This makes a selective material such as $SiO_2$, $Al_2O_3$, $TiO_2$, ZrO, or W preferable as the material of the walls.

When the $SiO_2$ walls 17 are formed in the manner described above, if the thickness T of the $SiO_2$ film formed on the ridges 19 is smaller than 50 nm, it is not easy to form a $SiO_2$ film that is uniformly thick within the wafer surface. By contrast, when the $SiO_2$ walls 17 are formed in the manner described above, if the thickness T of the $SiO_2$ film formed on the ridges 19 is greater than 3 μm, undesirably, stress acts from the $SiO_2$ film to the nitride semiconductor thin films. Hence, in a case where $SiO_2$ walls 17 are formed, it is preferable that the thickness T of the $SiO_2$ film formed on the ridges 19 be 50 nm or more but 3 μm or less.

On the other hand, if the width D of the $SiO_2$ walls 17 in the direction parallel to the [11-20] direction is less than 1 μm, undesirably, it is difficult to perform the process, and thus it is difficult to form the $SiO_2$ walls 17. By contrast, if the width D is greater than 25 μm, undesirably, stress acts from the $SiO_2$ film to the nitride semiconductor thin films. Hence, it is preferable that the width D of the $SiO_2$ walls 17 in the direction parallel to the [11-20] direction be 1 μm or more but 25 μm or less.

Moreover, if the depth Y of the engraved regions 16 formed in the manner described above is less than 1 μm, the engraved regions 16 are filled by the nitride semiconductor growth layer 11. This makes it impossible for the strains present within the nitride semiconductor growth layer 11 to escape, and thus results in development of cracks. By contrast, if the depth Y is 20 μm or more, when, in the chip separation step performed later, the wafer is polished until it becomes about 100 μm thick, the wafer may break. Hence, it is preferable that the depth Y of the engraved regions 16 be 1 μm or more but 20 μm or less.

On top of the processed substrate 10 produced as described above, by appropriately using a well-known technique such as MOCVD, a nitride semiconductor growth layer 11 composed of a plurality of nitride semiconductor thin films, for example as shown in FIG. 19, is epitaxially grown to produce the nitride semiconductor laser device shown in FIGS. 11a and 11b.

Figure 13:
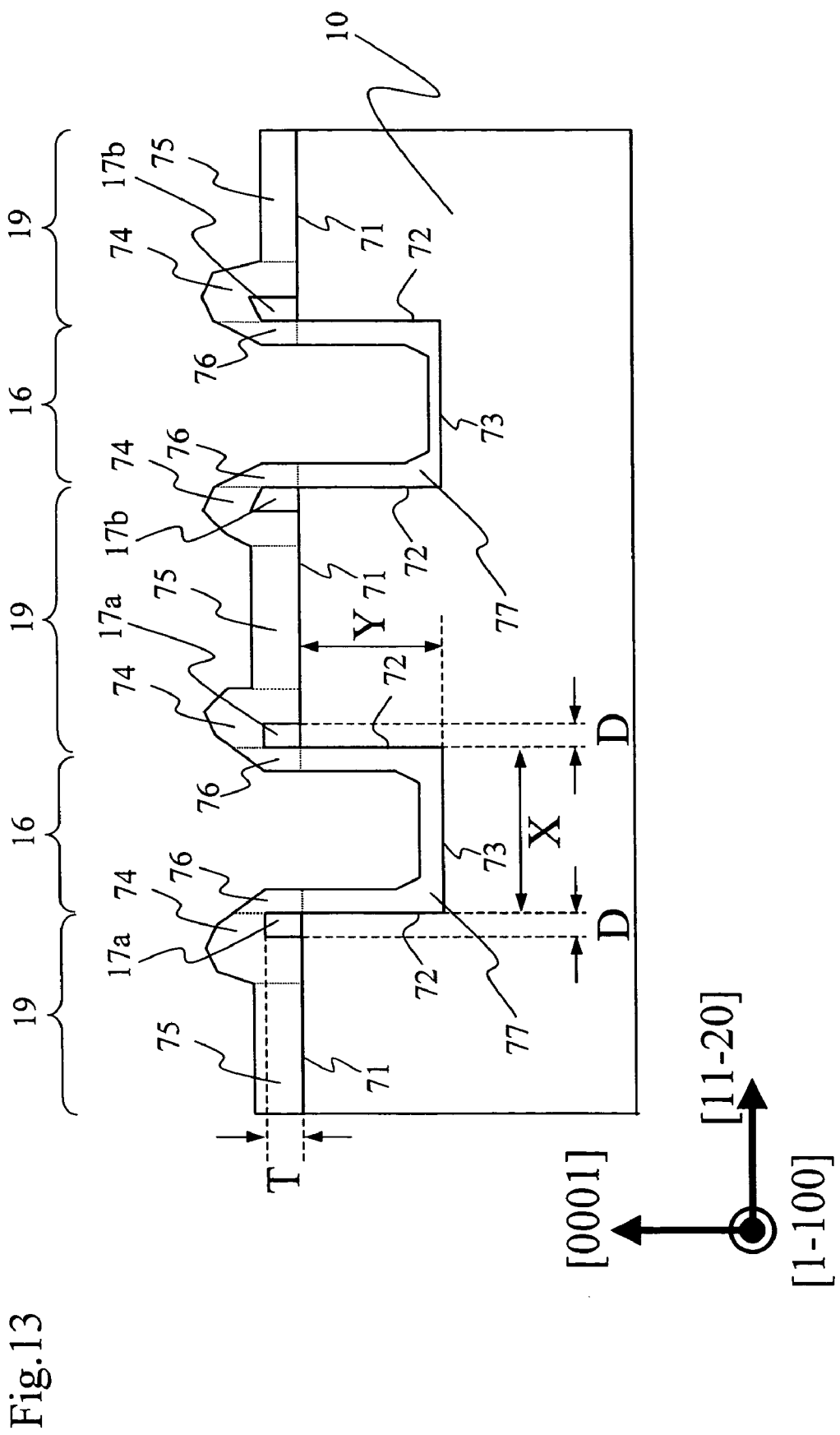
FIG. 13 is a schematic sectional view of part of the wafer having a nitride semiconductor thin film grown on a processed substrate in the second embodiment of the invention.

FIG. 13 shows a schematic sectional view of a wafer having nitride semiconductor thin films grown thereon with a view to laying a nitride semiconductor growth layer 11 on the processed substrate 10 described above having the engraved regions 16 and the ridges 19 formed thereon and having the $SiO_2$ walls 17 formed along both edges of the ridges 19 above. As shown in FIG. 13, the nitride semiconductor thin films grow as top growth portions 75 in central portions on top portions 71 of the ridges 19, as inflow prevention portions 74 in both edge portions of the top portions 71 of the ridges 19 where the $SiO_2$ walls 17a and 17b (corresponding to the $SiO_2$ walls 17 shown in FIG. 11a) are formed, and as engraved region growth portions 77 on side portions 72 and floor portions 73 in the engraved regions 16. The inflow prevention portions 74 couple, via growth portions 76, to the engraved region growth portions 77.

As shown in FIG. 13, owing to the processed substrate 10 having the $SiO_2$ walls 17a and 17b, the inflow prevention portions 74 have an elevated shape. This permits the $SiO_2$ walls 17a and 17b to restrain atoms and molecules of the source materials of the nitride semiconductor thin films from migrating and thereby moving from the top portions 71 of the ridges 19 into the engraved regions 16. The inflow prevention portions 74 thus having an elevated shape help more powerfully restrain atoms and molecules of the source materials of the nitride semiconductor thin films from migrating and thereby moving from the top portions 71 of the ridges 19 into the engraved regions 16.

Specifically, even if atoms and molecules of the source materials of the nitride semiconductor thin films attach to the surface of the top growth portions 75 grown on the top portions 71 of the ridges 19, the inflow prevention portions 74 restrain them from migrating and thereby moving to the top growth portions 75 and to the side portions 72 and floor portions 73 in the engraved regions 16. Thus, the atoms and molecules that have attached to the surface of the top growth portions 75 migrate only on the surface of the top growth portions 75. This enhances the flatness of the surface of the top growth portions 75, and helps form uniformly thick nitride semiconductor thin films. The width of the inflow prevention portions 74 in the direction parallel to the [11-20] direction is about 10 μm to 30 μm.

In this embodiment and in the third embodiment described later, the "flatness" indicates the flatness on the surface of the top growth portions 75 and 95 (described later, see FIG. 16) and on the surface of the nitride semiconductor thin films laid on top of those top growth portions 75 and 95. As shown in FIG. 13, the sectional shape of the $SiO_2$ walls 17a and 17b cut along a plane perpendicular to the direction in which they extend may be rectangular, like the $SiO_2$ wall 17a, or any other than that, like the $SiO_2$ wall 17b.

Figure 14A:
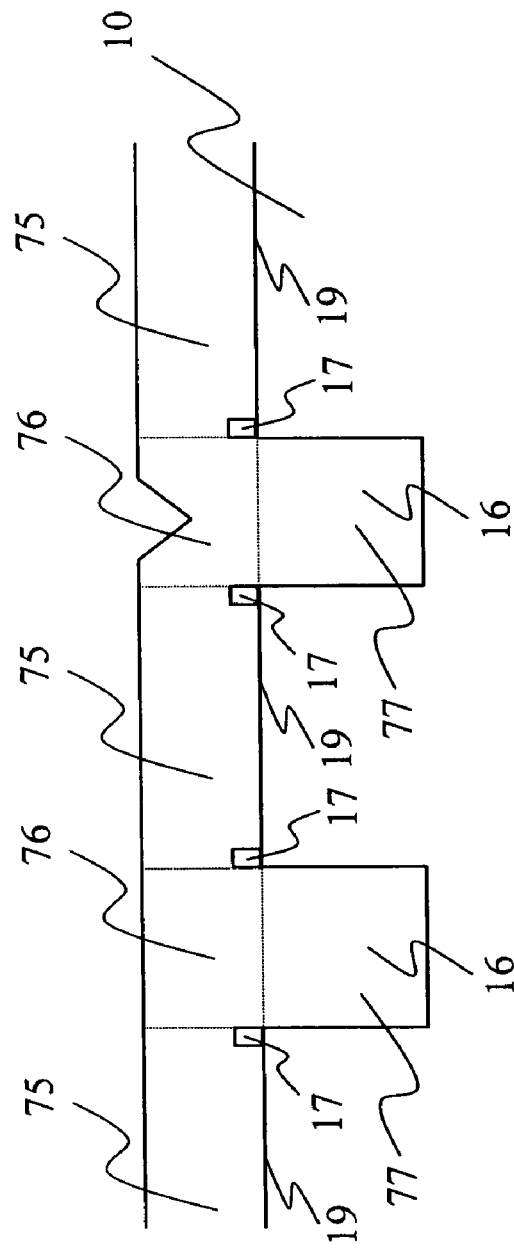
FIG. 14a is a schematic sectional view of the processed substrate in a state where the engraved regions are filled by the nitride semiconductor thin film in the second embodiment of the invention.
Figure 14B:
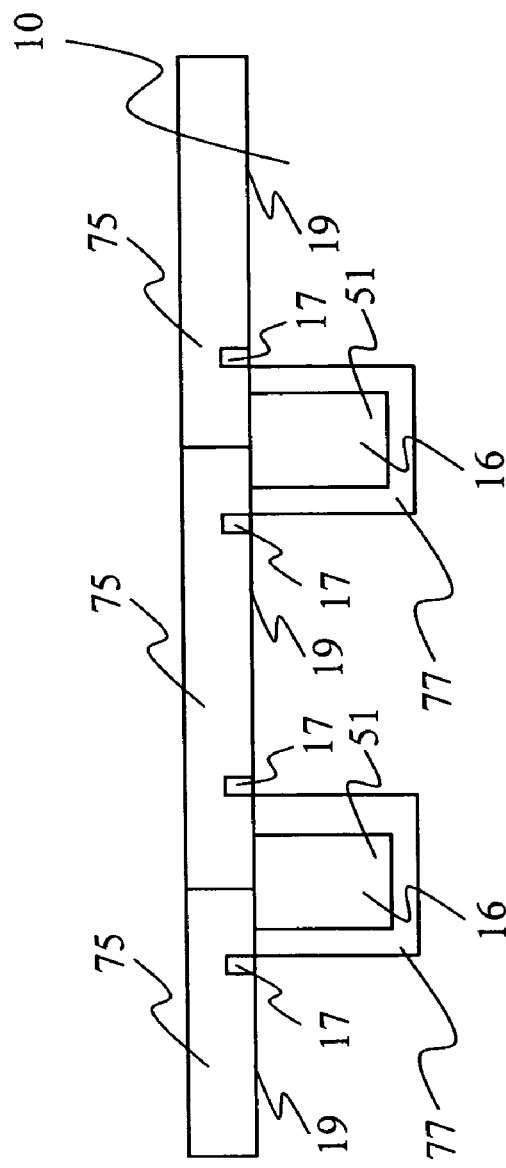
FIG. 14b is a schematic sectional view of the processed substrate in a state where hollow spaces surrounded by the nitride semiconductor thin film are formed in the engraved regions in the second embodiment of the invention.

When the nitride semiconductor growth layer 11 is laid in this way, if the opening width X of the engraved regions 16 is less than 1 μm, as shown in FIG. 14a, the engraved regions 16 are completely filled by the engraved region growth portions 77, resulting in cracks. Or, as shown in FIG. 14b, the top growth portions 75 that grow on the surface of the ridges 19 grow laterally until different parts of the top growth portions 75 meat above the engraved regions 16, leaving hollow spaces 51. This degrades the flatness on the surface of the top growth portions 75, and contributes little to the reduction of cracks. Hence, the opening width X of the engraved regions 16 needs to be 1 μm or more.

As described above, the inflow prevention portions 74 make it possible to obtain good surface flatness on the top growth portions 75 formed on the top portions 71 of the ridges 19. On the top growth portions 75 thus having good flatness, a plurality of nitride semiconductor thin films are laid one after another to form a nitride semiconductor growth layer 11 structured, for example, as shown in FIG. 19, and in this way is produced the nitride semiconductor laser device shown in FIG. 11a. The nitride semiconductor growth layer 11 is formed by appropriately using well-known techniques such as MOCVD, and therefore, in this regard, no detailed description will be given.

On the surface of this nitride semiconductor growth layer 11 formed on top of the processed substrate 10 described above, there are formed a laser stripe 12 that serves as a laser light waveguide and a $SiO_2$ film 13 that is laid to sandwich the laser stripe 12 and that serves for current constriction. On the surface of the laser stripe 12 and the $SiO_2$ film 13, a p-side electrode 14 is formed, and, on the bottom surface of the processed substrate 10, an n-side electrode 15 is formed. Here, a middle portion of the surface of the p-side electrode 14 located right above the laser stripe 12 is formed into an elevated stripe 18. Let the distance from the middle of the laser stripe 12 to the laser stripe 12 side edge of the $SiO_2$ wall 17 be "e". In this embodiment, this distance "e" equals 40 μm.

Moreover, in this nitride semiconductor laser device, the p-side electrode 14 is formed of, from the side thereof closer to the nitride semiconductor growth layer 11, Mo/Au, Mo/Pt/Au, a single Au layer, or the like. In this embodiment, a $SiO_2$ film 13 is used as an insulating film for current constriction. Instead, it is possible to use ZrO, $TiO_2$, or the like as the material for the insulating film. It should be noted that, for easy understanding of the sectional structure, FIGS. 11a and 11b show a section of a nitride semiconductor laser device produced by performing chip separation at positions different from engraved regions 16 at which chip separation is actually performed as will be described later.

The nitride semiconductor laser device having a ridge structure as described above is produced, after the nitride semiconductor growth layer 11 is laid on top of the processed substrate 10, by appropriately using well-known techniques, and therefore, in this regard, no detailed description will be given. Then, the plurality of nitride semiconductor laser devices formed on top of the processed substrate 10 (wafer) by laying the nitride semiconductor growth layer 11 thereon are separated into individual devices. Here, first, part of the processed substrate 10 is removed so that the wafer is made as thin as about 100 μm. Thereafter, the n-side electrode 15 is formed on the bottom surface of the processed substrate 10. Subsequently, the wafer is cleaved in the direction parallel to the [11-20] direction (see FIGS. 11a and 11b) to form resonator end faces so that the wafer is thereby split into bars each having a plurality of nitride semiconductor laser devices as shown in FIGS. 15a and 15b. Here, in this embodiment, the resonator length, i.e., the length in the direction of the resonator (i.e., the [1-100] direction), is 600 μm. The resonator length, however, does not necessarily have to be equal to that value, but may be any value preferably in the range from 300 μm to 1,200 μm. Then, on the resonator end faces, dielectric films of $SiO_2$ and $TiO_2$ are alternately vapor-deposited by electron beam deposition or the like to form a dielectric multilayer reflective film. This dielectric multilayer reflective film does not necessarily have to be formed of $SiO_2/TiO_2$, but may be formed of, for example, $SiO_2/Al_2O_3$.

In this way is produced the bar having a plurality of nitride semiconductor laser devices formed thereon as shown in FIGS. 15a and 15b. FIG. 15b is part of a schematic sectional view of a bar obtained by cleaving the wafer in the direction parallel to the [11-20] direction (see FIGS. 11a and 11b) to form resonator end faces, and FIG. 15a is a top view thereof.

In the bar structured as shown in FIGS. 15a and 15b, on top of the processed substrate 10 having the engraved regions 16 formed thereon and having the $SiO_2$ walls 17 formed along both edges of the ridges 19, the nitride semiconductor growth layer 11 is laid, on the surface of which are formed p-side electrode pads 80 each composed of an insulating film such as a $SiO_2$ film 13 and a p-side electrode 14 (see FIGS. 11a and 11b). Since wire bonding is performed on the surface of the p-side electrode pads 80, these are typically given a thickness of about 100 nm to 1 μm. Here, the nitride semiconductor growth layer 11 has a current constriction layer inside, and, in an "embedded current constriction laser" that performs current constriction with that layer, the p-side electrode pads 80 are each composed solely of a p-side electrode 14. Moreover, on the top surfaces of the p-side electrode pads 80 structured as described above, elevated stripes 18 are formed, and, on the bottom surface of the processed substrate 10, an n-side electrode 15 is formed. As shown in FIG. 15a, let the distances from both edges of the p-side electrode pad 80 to the edges of the engraved regions 16 adjacent respectively to those edges of the p-side electrode pad 80 be P and Q, respectively.

As shown in FIGS. 15a and 15b, the p-side electrode pads 80 formed as described above are not formed above the engraved regions 16. This is because, since the surface of the nitride semiconductor growth layer 11 is not flat above the engraved regions 16, forming an insulating film such as $SiO_2$ on the surface there results in producing cracks, through dislocations, holes, locally thinner parts, etc. These regions, as compared with the regions elsewhere than above the engraved regions 16, exhibit low electrical insulation and cause current leakage.

Moreover, even if, when the engraved regions 16 are completely filled, no grooves or depressions are recognized visually, in the process of the engraved regions 16 becoming filled by the nitride semiconductor thin films laid therein, the nitride semiconductor thin films in the engraved regions 16 develop defects, dislocations, cracks, etc. Thus, forming $SiO_2$ or the like on the surface of the nitride semiconductor growth layer 11 above the engraved regions 16 results in low electrical insulation. As a result, if the p-side electrode pads 80 are formed above the engraved regions 16 or depressions, there may be observed spontaneous emission light in those regions. This spontaneous emission light is produced when a leak current flows through a nitride semiconductor laser device. Moreover, since the inflow prevention portions 74 of which the width in the direction parallel to the [11-20] direction is about 10 μm to 30 μm are formed along both edges of the ridges 19, it is undesirable to form the p-side electrode pads 80 in those regions.

Based on the foregoing, when the p-side electrode pads 80 were formed 30 μm or more apart from the edges of the engraved regions 16, no spontaneous emission light as mentioned above was observed elsewhere than from the regions of the laser stripes 12 (see FIG. 11a). Hence, it is preferable that the distances P and Q from the edges of the engraved regions 16 to both edges of the p-side electrode pads 80 be both 30 μm or more.

This embodiment deals with a ridge-stripe-type laser that achieves current constriction by the use of an insulating film such as $SiO_2$ formed on top of a nitride semiconductor growth layer 11, but may be applied to any other type of laser as well, such as a VSIS (V-channeled substrate inner stripe) type laser having a current constriction layer inside a nitride semiconductor growth layer 11. In this type of laser, there is no insulating film for current constriction on the surface of the nitride semiconductor growth layer 11, and the p-side electrode pad 80 is composed solely of a p-side electrode 14. Also in this type of laser, when the p-side electrode pad 80 was formed in the engraved region 16, as in a ridge-stripe-type laser, a large leak current flowed, degrading the characteristics of the nitride semiconductor laser device and causing it to fail to lase. This is considered to result from degraded crystallinity of the current constriction layer located above the engraved region 16. Thus, also in lasers of the VSIS type and the like, it is preferable that the distances P and Q from the edges of the engraved regions 16 to both edges of the p-side electrode pads 80 be both 30 μm or more.

This embodiment deals with a structure in which an n-type GaN substrate is used as the processed substrate 10 and the electrode pad formed on the surface of the nitride semiconductor growth layer 11 is a p-side electrode pad, but may be applied to any other structure; for example, it may also be applied to a nitride semiconductor laser device so structured that the processed substrate 10 is formed of a p-type semiconductor material, the surface of the nitride semiconductor growth layer 11 is formed of an n-type nitride semiconductor thin film, and the electrode pad formed on the surface thereof is an n-type electrode pad.

When wire bonding is performed, though depending on the structure of the nitride semiconductor laser device, the diameter of the ball portion at the tip of the wire is typically about 80 μm, and accordingly the p-side electrode pads 80 need to be 80 μm or more wide. Thus, the interval T between adjacent engraved regions 16 needs to fulfill the formula T≧[the width (80 μm or more) of the p-side electrode pads 80+60 μm (the minimum value of the sum of the distances P and Q from both edges of the p-side electrode pads 40 to the edges of the engraved regions 16)]. If the interval T between adjacent engraved regions 16 is smaller than 140 μm, it is difficult to produce the nitride semiconductor laser device. Thus, it is preferable that the interval T between adjacent engraved regions 16 be 140 μm or more. When T is greater than 4 mm, cracks are likely to develop within the nitride semiconductor thin films laid. Hence, it is preferable that the interval T between adjacent engraved regions 16 be 140 μm or more but 4 mm or less.

The above-described bar shown in FIGS. 15a and 15b is then subjected to chip separation as in the first embodiment to produce discrete nitride semiconductor laser devices. Now, how chip separation is achieved will be described with reference to the drawings.

In this embodiment, first, scribing is performed at either chip separation positions 81 or chip separation positions 82 shown in FIG. 15b. The chip separation positions 82 are on the top surface of the nitride semiconductor growth layer 11 laid in the engraved regions 16 formed on the processed substrate 10, and the chip separation positions 81 are on the bottom surface of the part of the processed substrate 10 located right below the engraved regions 16. It is preferable that the scribe lines be located at the middles of the engraved regions 16. However, in this embodiment, as described above, the engraved regions 16 are not completely filled by the nitride semiconductor growth layer 11, and there are left grooves, which serve as guides in chip separation. Thus, even if the scribe lines are located off the middles of the engraved regions 16, so long as they run within the engraved regions 16, there is no risk of chipping or separation in an unintended direction.

Also when the scribe lines run outside the engraved regions 16, during chip separation, splitting may proceed off the scribe lines and thus in an unintended direction. Even splitting proceeds in an unintended direction in this way, once the splitting reaches the neighboring engraved region 16, it then proceeds along the groove inside the engraved region 16. Thus, the neighboring nitride semiconductor laser devices are saved from destruction.

In this embodiment, as shown in FIGS. 15a and 15b, one nitride semiconductor laser device is produced on each ridge 19, i.e., the non-engraved region between two adjacent engraved regions 16. Instead, it is also possible to produce a plurality of nitride semiconductor laser devices there. In this embodiment, the engraved regions 16 are each formed by one depressed portion. Instead, it is also possible to form each engraved region with a plurality of depressed portions and a narrow flat portion sandwiched between those depressed portions.

By the above-described method according to this embodiment, a plurality of nitride semiconductor laser devices were produced by using a processed substrate having $SiO_2$ walls 17 formed thereon with a thickness T of 500 nm and a width D of 3 μm in the direction parallel to the [11-20] direction. Of the nitride semiconductor laser devices produced, 100 were randomly extracted and subjected to measurement of the FWHMs of their FFPs in the horizontal and vertical directions. Here, those nitride semiconductor laser devices which exhibited FFPs of which the FWHMs were within ±1° of the design value thereof were evaluated as acceptable. The result was that the number of nitride semiconductor laser devices that exhibited FFPs of which the FWHMs fulfilled the requirement was 92. By contrast, among nitride semiconductor laser devices produced by the conventional technique described earlier, only 30 were found acceptable. As compared with this, the method of this embodiment clearly provides a greatly improved yield.

The reason is that, in the regions where nitride semiconductor laser devices were produced, forming the inflow prevention portions 74 along both edges of the ridges 19 helped restrain atoms and molecules of the source materials of the nitride semiconductor thin films from migrating into the engraved regions 16. That is, the surface flatness was enhanced in the regions where nitride semiconductor laser devices were produced, and as a result the thicknesses of the individual nitride semiconductor thin films forming the nitride semiconductor growth layer 11 were made uniform.

Moreover, the use of the processed substrate 10 having the engraved regions 16 formed thereon permits the strains present within the nitride semiconductor growth layer 11 to become uneven within the wafer surface, letting them act in different directions. This permits the strains present within the nitride semiconductor growth layer 11 to escape. Furthermore, leaving the engraved regions incompletely filled by the nitride semiconductor growth layer 11 promoted the escaping of the strains. Thus, no cracks developed.

Third Embodiment

Figure 16:
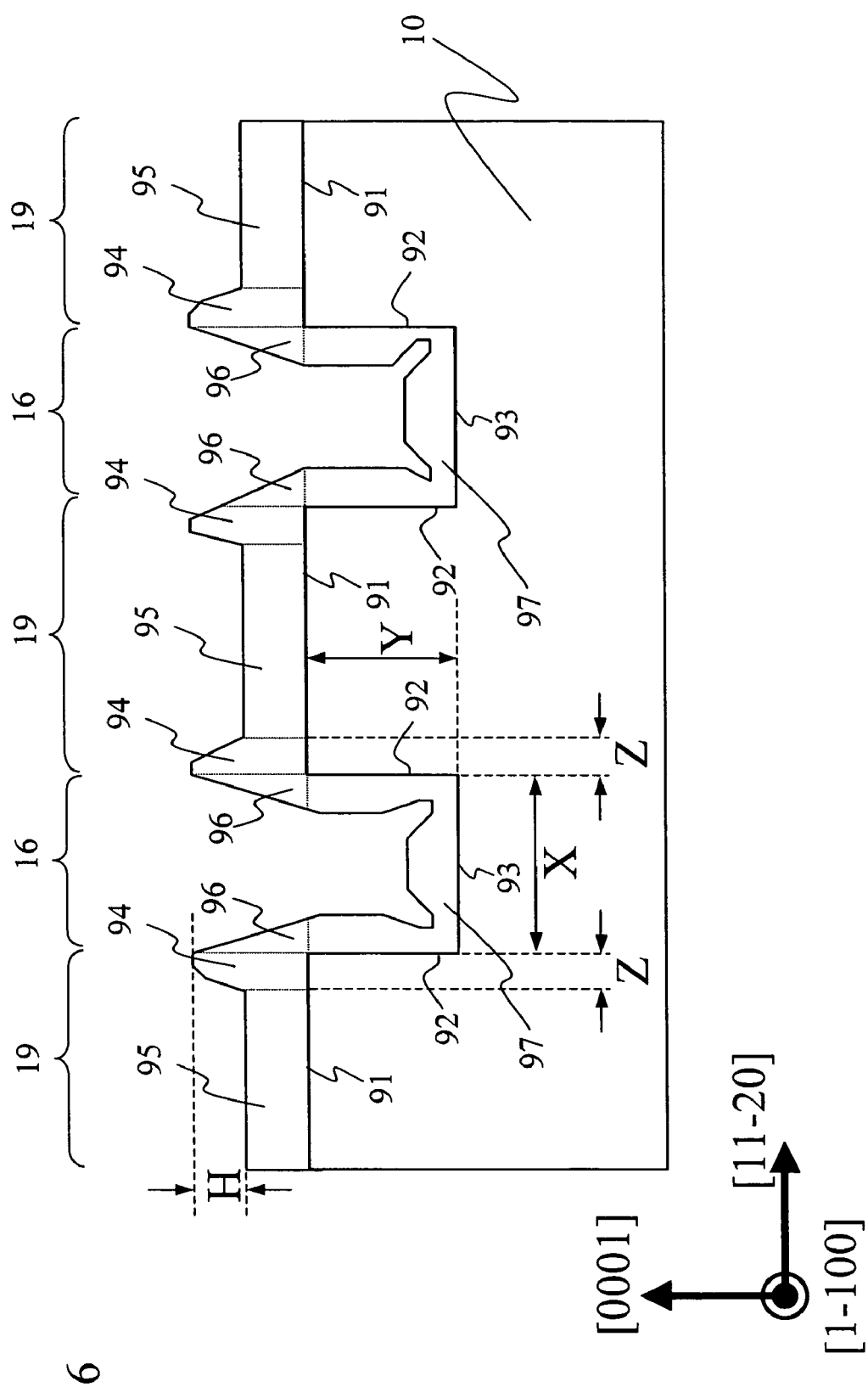
FIG. 16 is a partial schematic sectional view of the wafer having a nitride semiconductor thin film grown on a processed substrate in a third embodiment of the invention.

Next, a third embodiment of the present invention will be described with reference to the relevant drawings. FIG. 16 is a schematic sectional view of part of a wafer having nitride semiconductor thin films grown on top of a processed substrate 10 in this embodiment. In this embodiment, unlike in the second embodiment, no $SiO_2$ walls are formed along the edges of ridges 19, i.e., the non-engraved regions, on the processed substrate 10.

FIG. 16 is a schematic sectional view of a wafer having nitride semiconductor thin films grown on such a processed substrate 10 having engraved regions 16 formed thereon. As shown in FIG. 16, the nitride semiconductor thin films grow as top growth portions 95 in central portions of top portions 91 of the ridges 19, as inflow prevention portions 94 in both edge portions of the top portions 91 of the ridges 19, near the engraved regions 16, and as engraved region growth portions 97 on side portions 92 and floor portions 93 in the engraved regions 16. The inflow prevention portions 94 couples, via growth portions 96, to the engraved region growth portions 97.

As shown in FIG. 16, in this embodiment, even though no $SiO_2$ walls are formed, the inflow prevention portions 94 are formed in an elevated shape, and, in these inflow prevention portions 94, the nitride semiconductor thin films are grown thicker than on the top growth portions 95 to produce a level difference. In the following description, this level difference is represented by H. This difference in the thickness of the nitride semiconductor growth layer 11 between in the inflow prevention portions 94 and in the top growth portions 95 results from the fact that the growth rate of the nitride semiconductor thin films in the inflow prevention portions 94, i.e., both edge portions of the top portions 91 of the ridges 19 near the engraved regions 16, is higher than the growth rate of the nitride semiconductor thin films on the top growth portions 95, i.e., the regions on the top portions 91 of the ridges 19 excluding both edge portions thereof. This great difference in the growth rate of the nitride semiconductor thin films between in the inflow prevention portions 94 and in the top growth portions 95 results from the difference in re-evaporation probability, i.e., the probability with which the atoms and molecules of the source materials of the nitride semiconductor thin films which have once been absorbed on the growth surface of the nitride semiconductor thin films evaporate back from the growth surface without forming the nitride semiconductor thin films.

Specifically, the material atoms and molecules that have attached to the surface of the nitride semiconductor thin films grown on the top portions 91 of the ridges 19 between the engraved regions 16 first migrate or otherwise move across the growth surface to regions stable in terms of energy, where the material atoms and molecules couple with the atoms and molecules of the surface to form the nitride semiconductor thin films. If they cannot move to regions stable in terms of energy within a predetermined period of time, they reevaporate from the growth surface. Moreover, it has been found that, when engraved regions 16 are formed on the surface of a substrate as on the processed substrate 10, the regions most stable in terms of energy in the top portions 91 of the ridges 19 between the engraved regions 16 are both edge portions thereof near the engraved regions 16. In these edge portions near the engraved regions 16, the reevaporation probability is low. As a result, the growth rate of the nitride semiconductor thin films in both edge portions of the top portions 91 of the ridges 19 near the engraved regions 16 is higher than elsewhere in the top portions 91 of the ridges 19, and thus the inflow prevention portions 94 are formed where the nitride semiconductor thin films grow thicker than in the top growth portions 95.

These inflow prevention portions 94 are formed by growing a GaN or AlGaN layer on top of the processed substrate 10. A comparison between GaN and AlGaN shows that, when a GaN layer is laid, atoms and molecules of the source materials of GaN more strongly tend to migrate. Thus, typically, the atoms and molecules of the source materials of GaN which have attached on the top portions 91 of the ridges 19 migrate and thereby move into the engraved regions 16, permitting a thick GaN layer to grow as the engraved region growth portions 97 on the surface of the side portions 92 and floor portions 93, and permitting the inflow prevention portions 94 to be formed with a level difference H as small as about 10 nm from the surface of the top growth portions 95. By contrast, when an AlGaN layer is laid, atoms and molecules (in particular, Al) of the source materials of the AlGaN only weakly tend to migrate. Thus, the atoms and molecules of the source materials of AlGaN which have attached to the top portions 91 of the ridges 19 do not move into the engraved regions 16 but remain on the top portions 91 of the ridges 19. The atoms and molecules of the source materials of AlGaN which have remained on the top portions 91 of the ridges 19 migrate across the top portions 91 of the ridges 19. Here, since both edge portions of the top portions 91 of the ridges 19 are regions stable in terms of energy as described above, in these regions, the atoms and molecules of the source materials of AlGaN are restrained from reevaporating, and instead a film is formed, with the result that the AlGaN layer grows thicker than the top growth portions 95 to form the inflow prevention portions 94. The inflow prevention portions 94 formed by this AlGaN layer grow thick when the Al content in the AlGaN is 2% or more. In this way, as a result of the inflow prevention portions 94 being formed, the atoms and molecules of the source materials of AlGaN which have attached to the surface of the top growth portions 95 migrate only on the surface of the top growth portions 95. This permits the top growth portions 95 to be formed with good surface flatness. The thus formed inflow prevention portions 94 have a width Z (see FIG. 16) of about 10 μm to 30 μm in the direction parallel to the [11-20] direction.

Figure 17:
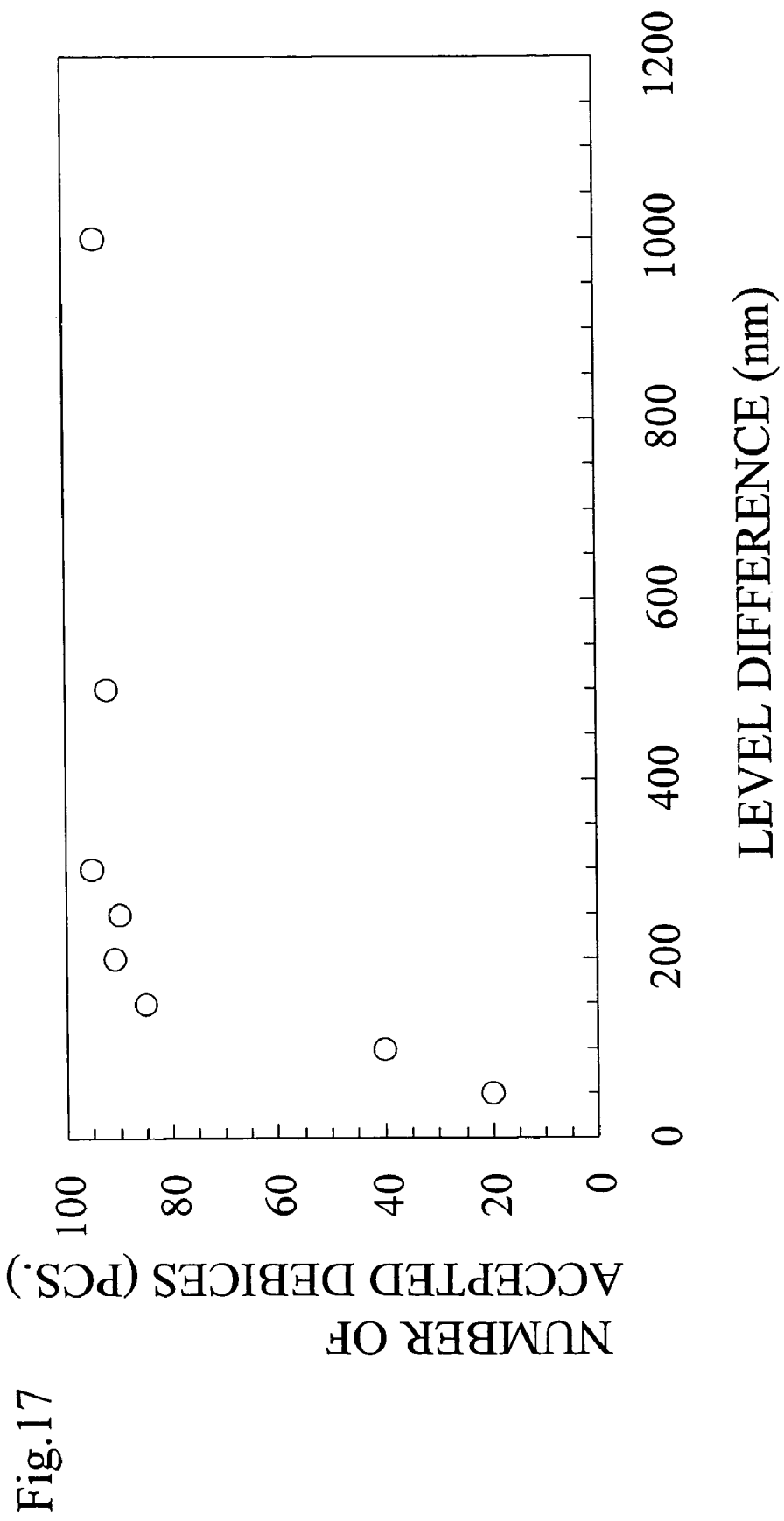
FIG. 17 is a diagram showing the correlation between the level difference H and the number of accepted devices.
Figures 18A, 18B:
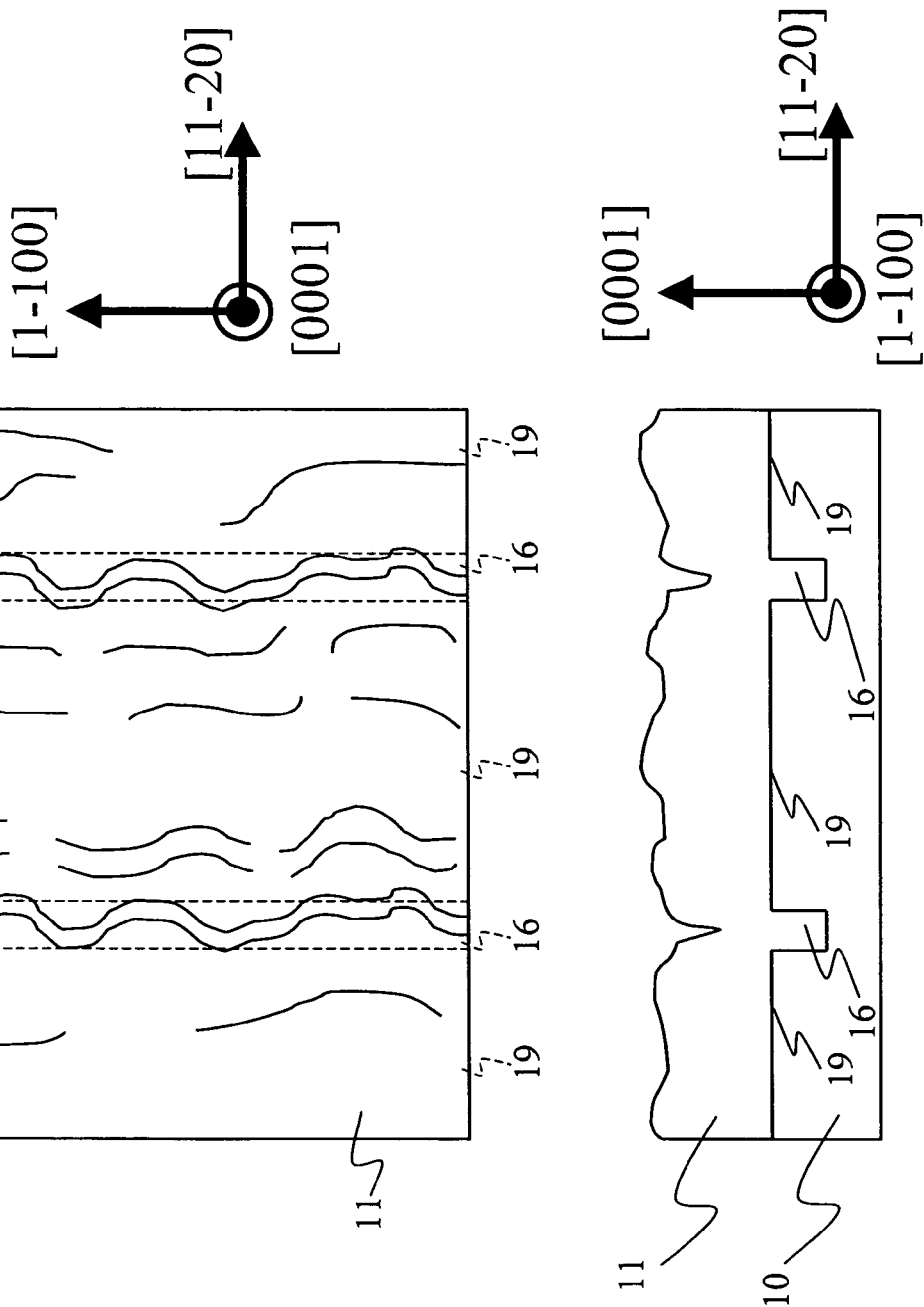
FIG. 18a is a schematic top view of a conventional wafer having a nitride semiconductor growth layer laid on top of a processed substrate.
FIG. 18b is a schematic sectional view of a conventional wafer having a nitride semiconductor growth layer laid on top of a processed substrate.

In this way, on top of the processed substrate 10 having the engraved regions 16 and ridges 19 formed thereon, the nitride semiconductor growth layer 11 composed of a plurality of nitride semiconductor thin films was laid to produce a plurality of nitride semiconductor laser devices having, as described above, a level difference H produced between the surface of the top growth portions 95 and the tip ends of the inflow prevention portions 94. Of the nitride semiconductor laser devices produced, 100 were randomly extracted and subjected to measurement of the FWHMs of their FFPs in the horizontal and vertical directions. Here, those nitride semiconductor laser devices which exhibited FFPs of which the FWHMs were within ±1° of the design value thereof were evaluated as acceptable. FIG. 17 is a diagram showing the correlation between the level difference H and the number of nitride semiconductor laser devices evaluated as acceptable. As shown in FIG. 17, when the level difference H was 150 nm or more, the number of accepted nitride semiconductor laser devices was 85 or more, providing high yields. By contrast, when the level difference H was less than 150 nm, the number of accepted nitride semiconductor laser devices was 40 or less, exhibiting a sharp drop in yields. This results from the fact that, in nitride semiconductor laser devices with a level difference H less than 150 μm, the thicknesses of the individual nitride semiconductor thin films laid on top of the top portions 91 of the ridges 19 vary not only within the wafer surface but even within a single nitride semiconductor laser device. Thus, to produce nitride semiconductor laser devices at a high yield, it is necessary that the level difference H between the surface of the top growth portions 95 and the tip ends of the inflow prevention portions 94 be 150 nm or more. That is, with a level difference H of 150 nm or more, when the nitride semiconductor growth layer 11 composed of a plurality of nitride semiconductor thin films is formed on top of the processed substrate 10, it is possible to obtain good surface flatness in the surface of the individual nitride semiconductor thin films laid on the top portions 91 of the ridges 19 and thereby reduce variations in the thicknesses of the individual nitride semiconductor thin films.

Moreover, when the inflow prevention portions 94 are formed by using AlGaN as described above, even if GaN, which strongly tends to migrate, is grown thereafter, the inflow prevention portions 94 restrain atoms and molecules of the source materials of GaN from migrating and thereby moving into the engraved regions 16. That is, as a result of an AlGaN layer, which weakly tends to migrate, being laid first on top of the processed substrate 10, the inflow prevention portions 94 are formed with a large level difference H from the surface of the top growth portions 95. Even when a GaN layer, which strongly tends to migrate, is laid thereafter, GaN is restrained from growing as the engraved region growth portions 97 on the side portions 92 and floor portions 93 in the engraved regions 16.

Figure 21A:
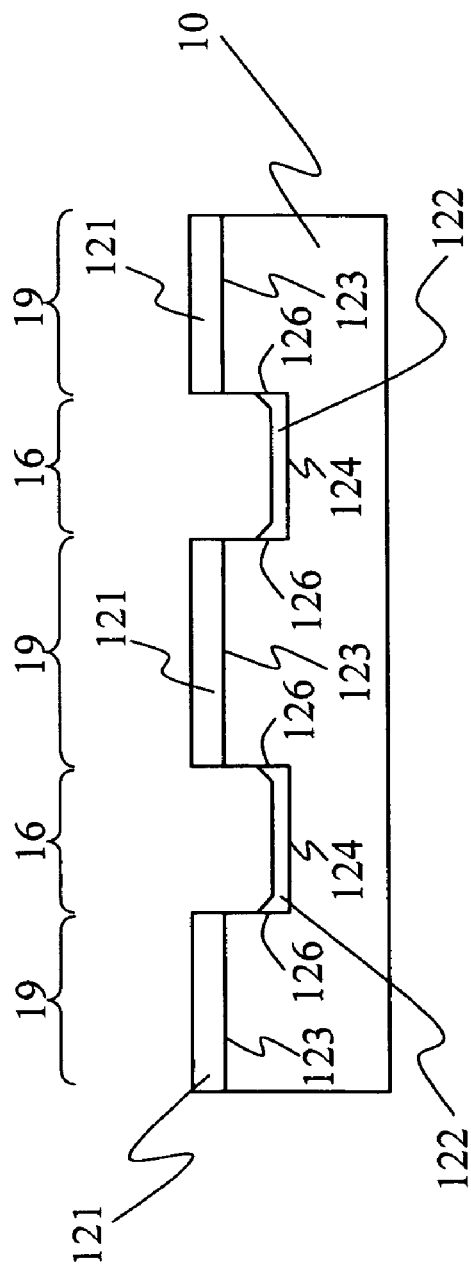
FIG. 21a is a schematic sectional view of the conventional processed substrate at an initial stage of growth of a nitride semiconductor thin film.
Figure 21B:
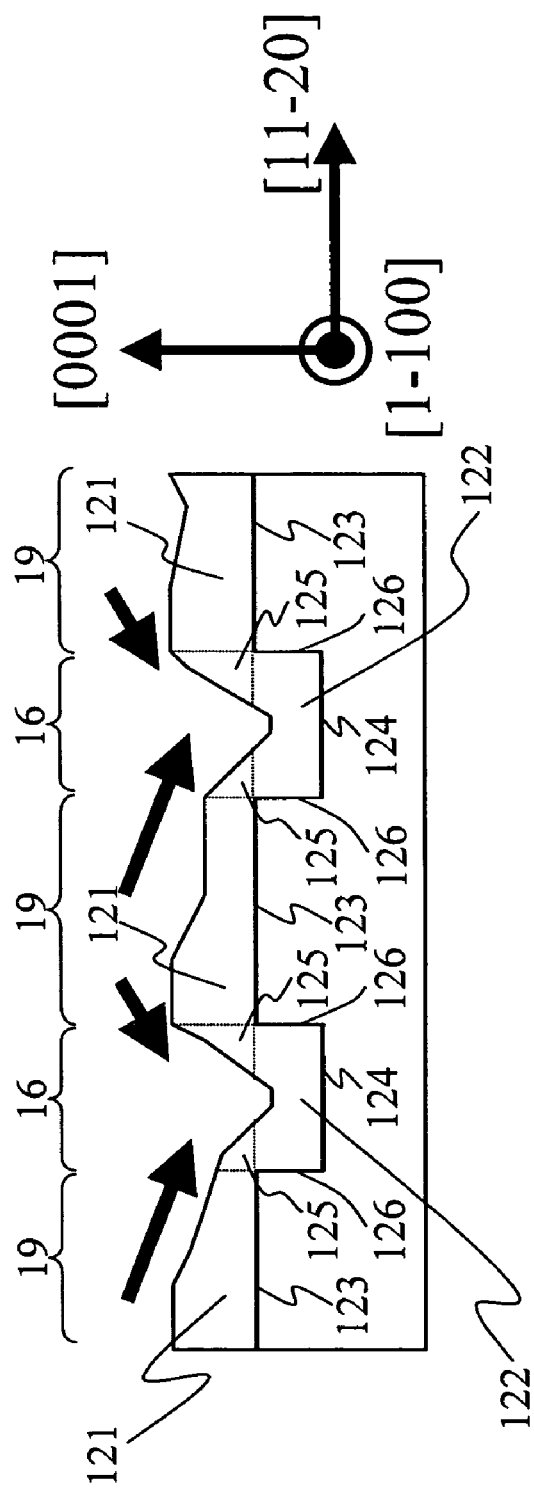
FIG. 21b is a schematic sectional view of the conventional processed substrate at an advanced stage of growth of a nitride semiconductor thin film.

Even in a case where a GaN layer is laid first on top of the processed substrate 10, if the GaN layer is 0.5 µm or less thick, by subsequently laying, for example, the nitride semiconductor thin films from the n-type $Al_{0.062}Ga_{0.938}N$ first clad layer 101 to the p-type GaN contact layer 109 shown in FIG. 19 one after another, it is possible to form inflow prevention portions 94 with a level difference H of 150 nm or more. On the other hand, in a case where the GaN layer is thicker than 0.5 µm, atoms and molecules of the source materials of GaN migrate and thereby flow into the engraved regions 16, resulting in notable growth of the engraved region growth portions 97 on the side portions 92 and floor portions 93. Thus, as shown in FIG. 21b, the engraved regions 16 are mostly filled by GaN. This further promotes migration into the engraved regions 16, making the thickness of the GaN layer uneven and degrading the surface flatness of the top growth portions 95. Based on these facts, in a case where a nitride semiconductor growth layer 11 structured as shown in FIG. 19 is laid, by making the thickness of the n-type GaN layer 100, which is in contact with the surface of the processed substrate 10, 0.5 µm or less, it is possible to restrain the inflow of atoms and molecules of the source materials from which the n-type GaN layer 100. The nitride semiconductor growth layer 11 may be formed by starting its growth from the $Al_{0.062}Ga_{0.938}N$ first clad layer 101 without laying the n-type GaN layer 100 on the surface of the processed substrate 10. Also in this way, the nitride semiconductor growth layer 11 can be formed with good surface flatness.

As described above, by growing AlGaN on the processed substrate 10 having the engraved regions 16 formed thereon, the inflow prevention portions 94 are formed. It has been found that, even when GaN is grown instead, by controlling the susceptor temperature and the mol ratio V/III of the source materials (the ratio of the flow rate in mol at which $NH_3$, the source material of N as a group V element, is supplied per unit time to the flow rate in mol at which TMGa, the source material of Ga as a group III element, is supplied per unit time), it is possible to restrain the migration of atoms and molecules of the source materials of GaN, and thereby to form inflow prevention portions 94 with a level difference H of 150 nm or more from the top growth portions 95. Below is given a description of the growth conditions under which, by growing GaN on top of the processed substrate 10 having the engraved regions 16 formed thereon, the inflow prevention portions 94 are formed with a level difference H of 150 nm or more from the surface of the top growth portions 95. The susceptor temperature is nearly equal to the surface temperature of the processed substrate.

Usually, when the n-type GaN layer 100 (see FIG. 19) is grown on top of the processed substrate 10, the temperature of the susceptor on which the processed substrate 10 (wafer) is placed is 1,075° C. Under this condition, atoms and molecules of the source materials of n-type GaN migrate to cause a large-scale inflow into the engraved regions 16, making it impossible to form the inflow prevention portions 94 with a sufficiently large level difference H. To overcome this, the temperature of the susceptor was set at 1,025° C., i.e., 50° C. lower than the usual susceptor temperature, and, when n-type GaN was grown at this temperature, the inflow prevention portions 94 were formed with a level difference H of 300 nm, i.e., larger than 150 nm, from the surface of the top growth portions 95. This is considered to result from the fact that the lower susceptor temperature contributed to a lower temperature on the surface of the processed substrate 10, restraining the migration of atoms and molecules (Ga atoms, N atoms, and the like) of the source materials of the n-type GaN.

On the other hand, with respect to the mol ratio V/III of the source materials, whereas usually the n-type GaN layer 100 is grown at a source material mol ratio V/III of 1,033, here the n-type GaN layer 100 was grown at a source material mol ratio V/III of 2,066, i.e., twice the usual ratio. Whereas at the usual source material mol ratio the level difference H between the top growth portions 95 and the inflow prevention portions 94 is about 10 nm, at a source material mol ratio V/III of 2,066, i.e., higher than 2,000, the level difference H was about 320 nm, and thus the inflow prevention portions 94 were formed with a sufficiently large level difference H. This is because, when atoms and molecules of the source materials of GaN attach to the growth film surface and migrate on the growth film surface under heat energy, if the source material mol ratio V/III is high, $NH_3$ is supplied in extremely large amounts, permitting N atoms in $NH_3$ and Ga atoms in TMGa to react quickly so as to be absorbed as GaN in the film. That is, when the source material mol ratio V/III is high, atoms and molecules (such as Ga atoms and N atoms) of the source materials of GaN are restrained from migrating on the growth film surface, with the result that, as when an AlGaN layer is laid, the inflow prevention portions 94 are formed with a large level difference H. By contrast, when the source material mol ratio V/III is low, $NH_3$ is supplied in small amounts, and therefore the Ga atoms that have attached to the growth film surface cannot react with N atoms quickly to form GaN. This makes longer the distance over which atoms and molecules, such as Ga atoms, of the source materials of GaN migrate to move, and thus promotes their inflow into the engraved regions 16. That is, by setting the source material mol ratio V/III equal to or higher than 2,000, it is possible to restrain the migration of atoms and molecules of the source materials of GaN on the growth film surface, and thus it is possible to form the inflow prevention portions 94 with a satisfactorily large level difference H, specifically a level difference H of 150 nm or more, from the surface of the top growth portions 95.

As described above, when the nitride semiconductor growth layer 11 composed of a plurality of nitride semiconductor thin films is laid on top of the processed substrate 10, to permit the n-type GaN layer 100 to be so laid as to form the inflow prevention portions 94 with a level difference H of 150 nm or more from the top growth portions 95, first, the n-type GaN layer 100 alone is laid with the susceptor at a temperature of 1,025° C., and then, with the susceptor temperature raised to 1,075° C., the layers from the $Al_{0.062}Ga_{0.938}N$ first clad layer 101 to the p-type GaN contact layer 109 excluding the multiple quantum well active layer 105 are laid. Incidentally, the multiple quantum well active layer 105 is laid at 700° C. to 800° C., because at 1,075° C. the vapor pressure of In is so high that In is not absorbed in the film.

Alternatively, the n-type GaN layer 100 alone is laid at a source material mol ratio V/III of 2,000 or more, and then at least the layers from the $Al_{0.062}Ga_{0.938}N$ first clad layer 101 to the n-type $Al_{0.062}Ga_{0.938}N$ third clad layer 103 are laid at a source material mol ratio V/III of 2,000 or less. For the subsequently laid layers from the n-type GaN guide layer 104 to the p-type GaN contact layer 109, the source material mol ratio V/III may be 2,000 or more, or 2,000 or less.

In this way, by laying the nitride semiconductor growth layer 11 on top of the processed substrate 10 with the n-type GaN layer 100 formed under a specific condition, it is possible to form the inflow prevention portions 94 with a level difference H of 150 nm or more from the top growth portions 95. This eventually makes it possible to form the nitride semiconductor growth layer 11 as nitride semiconductor thin films laid on top of one another with good surface flatness. When the n-type GaN layer 100 is formed, the two conditions described above may be combined together; specifically, it may be formed at a susceptor temperature of 1,025° C. and at a source material mol ratio V/III of 2,000 or more.

Moreover, when the inflow prevention portions 94 are formed during the formation of the nitride semiconductor growth layer 11, making the width Z of the inflow prevention portions 94 in the direction parallel to the [11-20] direction smaller helps widen the flat portions of the ridges 19, and thus makes these portions more suitable for the production of nitride semiconductor laser devices thereon. Furthermore, the more strongly atoms and molecules of the source materials of GaN tend to migrate, the narrower the width Z can be made. Undesirably, however, too strong a tendency to migrate results in inflow into the engraved regions 16. Hence, it is preferable that the width Z of the inflow prevention portions 94 be controlled to be 10 μm to 30 μm.

What is claimed is:

1. A method for fabricating a nitride semiconductor device, the method including:
   a first step of forming a processed substrate by forming, on a nitride semiconductor substrate of which at least part of a surface is a nitride semiconductor or on a substrate formed by laying a nitride semiconductor thin film on top of such a nitride semiconductor substrate, an engraved region formed as at least one depressed portion and a ridge portion formed as an non-engraved region; and
   a second step of laying a nitride semiconductor layer portion consisting of a plurality of nitride semiconductor thin films both on the engraved region and on a surface of the ridge portion formed on the processed substrate,
   wherein, in the first and second steps,
   let a sectional area of a region surrounded by a sectional portion of the depressed portion cut along a plane perpendicular to a direction in which the depressed portion extends and lines extending from the surface of the ridge portion parallel to the surface of the ridge portion be A, and
   let a sectional area occupied by the nitride semiconductor thin films laid in the depressed portion be B,
   then B/A, indicating a degree in which the depressed portion is filled by the nitride semiconductor thin films, is 0.8 or less.

2. The method of claim 1,
   wherein, in the first step, in the engraved region, the depressed portion is formed to have an opening width more than 100 μm, and
   wherein, in the second step, a total thickness from the surface of the ridge portion to a surface of the nitride semiconductor layer portion is 0.8 times a depth of the depressed portion or less.

3. The method of claim 1,
   wherein, in the first step, in the engraved region, the depressed portion is formed to have an opening width more than 30 μm but less than or equal to 100 μm, and
   wherein, in the second step, a total thickness from the surface of the ridge portion to a surface of the nitride semiconductor layer portion is twice a depth of the depressed portion or less.

4. The method of claim 1,
   wherein, in the first step, in the engraved region, the depressed portion is formed to have an opening width of 2 μm or more but 30 μm or less, and
   wherein, in the second step, a total thickness from the surface of the ridge portion to a surface of the nitride semiconductor layer portion is three times a depth of the depressed portion or less.

5. The method of claim 1, the method further comprising:
   a third step of forming a plurality of nitride semiconductor devices on top of the substrate by forming, on top of the nitride semiconductor layer portion laid on a surface of the processed substrate in the second step, electrode pads on which to perform wire bonding for connection with outside,
   wherein, in the third step, the electrode pads are not formed above the engraved region.

6. The method of claim 5,
   wherein, in the third step, the electrode pads are formed 5 μm or more apart from an edge of the engraved region.

7. The method of claim 1,
   wherein, in the first step, the ridge portion has a width of 92 μm or more but 4 mm or less.

8. The method of claim 1,
   wherein one nitride semiconductor device is formed in the ridge portion sandwiched between two adjacent engraved regions.

9. The method of claim 1,
   wherein a plurality of nitride semiconductor devices are formed in the ridge portion sandwiched between two adjacent engraved regions.

10. The method of claim 1,
    wherein chip separation is performed by performing scribing on a bottom surface of a part of the nitride semiconductor substrate located right below the engraved region of the processed substrate or a top surface of the nitride semiconductor substrate.

11. The method of claim 1, the method further comprising:
- a fourth step of cleaving the processed substrate in a direction perpendicular to a first direction in which the engraved region of the nitride semiconductor device extends in order to form bars each having a plurality of nitride semiconductor devices mounted thereon; and
- a fifth step of performing chip separation by splitting the bars in a direction parallel to the first direction in order to separate the individual nitride semiconductor devices on the bars into discrete chips,
- wherein, in the fifth step, the chip separation is performed after scribing is performed on an top surface of the nitride semiconductor layer portion laid on the engraved region or on a bottom surface of a part of the nitride semiconductor substrate located right below the engraved region so as to form scribe lines parallel to the first direction.

12. The method of claim 11, the method including the fourth and fifth step,
- wherein, in the fifth step, the chip separation is performed by performing scribing on a top surface of the nitride semiconductor layer portion laid on the engraved region or on a bottom surface of a part of the nitride semiconductor substrate located right below the engraved region and on a top surface of the nitride semiconductor layer portion laid on the ridge portion or on a bottom surface of a part of the nitride semiconductor substrate located right below the ridge portion.

13. The method of claim 11, the method including the fourth and fifth step,
- wherein, in the fifth step, the scribe lines are formed in a shape of solid lines from end to end on each bar.

14. The method of claim 11, the method including the fourth and fifth step,
- wherein, in the fifth step, the scribe lines are formed in a shape of solid lines in part of each bar.

15. The method of claim 11, the method including the fourth and fifth step,
- wherein, in the fifth step, the scribe lines are formed in a shape of broken lines from end to end on each bar.

16. The method of claim 11, the method including the fourth and fifth step,
- wherein, in the fifth step, the scribe lines are formed in an edge portion along an edge formed in a direction perpendicular to the first direction.

* * * * *